(12) United States Patent
Yamamoto et al.

(10) Patent No.: US 7,276,710 B2
(45) Date of Patent: Oct. 2, 2007

(54) LIGHT SOURCE UNIT AND EXPOSURE APPARATUS HAVING THE SAME

(75) Inventors: Takeshi Yamamoto, Kanagawa-ken (JP); Akira Miyake, Tochigi-ken (JP)

(73) Assignee: Canon Kabushiki Kaisha (JP)

( * ) Notice: Subject to any disclaimer, the term of this patent is extended or adjusted under 35 U.S.C. 154(b) by 204 days.

(21) Appl. No.: 11/181,192

(22) Filed: Jul. 13, 2005

(65) Prior Publication Data

US 2006/0011870 A1 Jan. 19, 2006

(30) Foreign Application Priority Data

Jul. 14, 2004 (JP) ............... 2004-207856

(51) Int. Cl.
  *A61N 5/00* (2006.01)
  *G03B 27/72* (2006.01)
(52) U.S. Cl. .............. 250/492.2; 355/69; 355/71; 355/53
(58) Field of Classification Search ............ 250/492.2, 250/548; 356/400, 239.2
See application file for complete search history.

(56) References Cited

U.S. PATENT DOCUMENTS

| | | | | |
|---|---|---|---|---|
| 4,870,289 A | * | 9/1989 | Sato et al. ................. | 250/548 |
| 5,149,972 A | * | 9/1992 | Fay et al. ................. | 250/461.1 |
| 5,390,203 A | * | 2/1995 | Miller ...................... | 372/29.02 |
| 6,355,570 B1 | * | 3/2002 | Nakata et al. ............. | 438/706 |
| 6,721,039 B2 | * | 4/2004 | Ozawa ....................... | 355/69 |
| 7,115,841 B2 | * | 10/2006 | Zeng et al. ................. | 219/476 |
| 7,190,452 B2 | * | 3/2007 | Zeng et al. ................. | 356/326 |
| 2001/0035945 A1 | * | 11/2001 | Ozawa ....................... | 355/69 |
| 2002/0094685 A1 | * | 7/2002 | Nakata et al. ............. | 438/689 |
| 2002/0153360 A1 | * | 10/2002 | Yamazaki et al. ...... | 219/121.66 |
| 2004/0012844 A1 | * | 1/2004 | Ohtsuki et al. .......... | 359/341.1 |

FOREIGN PATENT DOCUMENTS

| | | |
|---|---|---|
| JP | 2000-56099 | 2/2000 |
| JP | 2000-340395 | 12/2000 |
| JP | 2001-267096 | 9/2001 |

* cited by examiner

*Primary Examiner*—Nikita Wells
*Assistant Examiner*—Johnnie L Smith, II
(74) *Attorney, Agent, or Firm*—Morgan & Finnegan LLP

(57) ABSTRACT

A light source unit supplies the light radiated from the plasma, and includes a stabilizer for reducing a fluctuation of a position of the light radiated from the plasma.

5 Claims, 38 Drawing Sheets

LIGHT SOURCE UNIT AND EXPOSURE APPARATUS HAVING THE SAME

BACKGROUND OF THE INVENTION

The present invention relates generally to a light source unit, and more particularly to a light source for an exposure apparatus that produces fine patterns for micromechanics and manufactures various devices, e.g., a semiconductor chip, such as an IC and an LSI, a display device, such as a liquid crystal panel, a sensing device, such as a magnetic head, and an image-pickup device, such as a CCD. The inventive light source unit is suitable, for example, for an exposure apparatus that uses an X-ray and extreme ultraviolet ("EUV") light for a light source.

A reduction projection exposure apparatus has been conventionally employed which uses a projection optical system to project a circuit pattern of a mask (or a reticle) onto a wafer, etc. to transfer the circuit pattern, in manufacturing such a fine semiconductor device as a semiconductor memory and a logic circuit in the photolithography technology.

The minimum critical dimension ("CD") to be transferred by the projection exposure apparatus or resolution is proportionate to a wavelength of the light used for exposure, and inversely proportionate to the numerical aperture ("NA") of the projection optical system. The shorter the wavelength is, the better the resolution is. Along with the recent demands for finer processing to the semiconductor devices, a shorter wavelength of ultraviolet light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet ("UV") light has the limits to satisfy the rapidly promoting fine processing to the semiconductor device, and a reduction projection optical system using the EUV light with a wavelength of 10 to 15 nm shorter than that of the UV light has been developed to efficiently transfer a very fine circuit pattern of 0.1 µm or less.

The EUV light source uses, for example, a laser plasma light source. It irradiates a highly intensified pulse laser beam to a target material, such as a metallic thin film, inert gas and liquid droplets, in a vacuum chamber to generate high-temperature plasma for use as the EUV light with a wavelength of about 13 nm emitted from this.

As discussed, the EUV light source attracts attentions as a light source for the EUV exposure apparatus that manufactures the semiconductor devices, and various adjustments have been proposed. For example, one proposal detects the EUV light generated from (a generating position of) the plasma using a pinhole camera and a CCD, controls a target supplying position or a pulsed-laser irradiating position (which is a condensing position of the pulsed later), and maintains a generating position of the EUV light in place. See, for example, Japanese Patent Applications, Publication Nos. 2000-56099, 2000-340395, 2001-267096 and 2001-32096.

The prior art can adjust the light source when the generating position of the EUV light fluctuates in the EUV light source due to changes of a divergent angle and exit direction of the pulsed laser beam and a replacement of a target as a result of temperature changes of the laser rod and the crystal for generating second harmonics. However, the prior art cannot adjust the light source, for example, when a position and angle of a condenser mirror fluctuate and a positional relationship between the EUV light source and the subsequent optical system fluctuates due to the temperature changes and resonance. As a consequence, the EUV light supplied from the EUV light source does not become steady, and the exposure apparatus causes insufficient and non-uniform exposure dose, changes of an imaging position, and lowered exposure performance.

BRIEF SUMMARY OF THE INVENTION

Accordingly, the present invention is directed to a light source unit that maintains the supplied light in place relative to a reference position, and an exposure apparatus having the light source unit and realizes good exposure performance.

A light source unit according to one aspect of the present invention for supplying light radiated from the plasma includes a stabilizer for reducing a fluctuation of a position of the light radiated from the plasma.

An exposure apparatus according to another aspect of the present invention for exposing a pattern of a mask onto an object includes the above light source unit, an illumination optical system for illuminating the reticle using light supplied from the light source unit, and a projection optical system for projecting the pattern of the reticle onto the object.

A device manufacturing method includes the steps of exposing an object using the above exposure apparatus, and developing the exposed object.

A measuring apparatus for measuring reflectance of an object includes the above light source unit, an irradiating unit for irradiating light supplied from the light source unit upon the object, and a detector for detecting the light reflected from the object.

Other objects and further features of the present invention will become readily apparent from the following description of the preferred embodiments with reference to accompanying drawings.

BRIEF DESCRIPTION OF THE DRAWINGS

FIG. 13A shows a state a laser beam is irradiated so that a condensing point is placed on a target, and FIG. 13B shows a state that a position of the target is moved according to a position of the condensing point of the laser beam.

FIG 24A shows a state that the EUV light is not incident upon a first and second light intensity sensor, FIG. 24B shows a state that the EUV light is incident perpendicularly upon the first and second light intensity sensor, and FIGS. 24C and 24D show states that the EUV light is incident obliquely upon the first and second light intensity sensor.

FIG. 34A is a schematic sectional view of the EUV light, and FIG. 34B is graph of a light intensity of the EUV light shown in FIG. 34A.

DETAILED DESCRIPTION OF THE PREFERRED EMBODIMENTS

Figure 1:
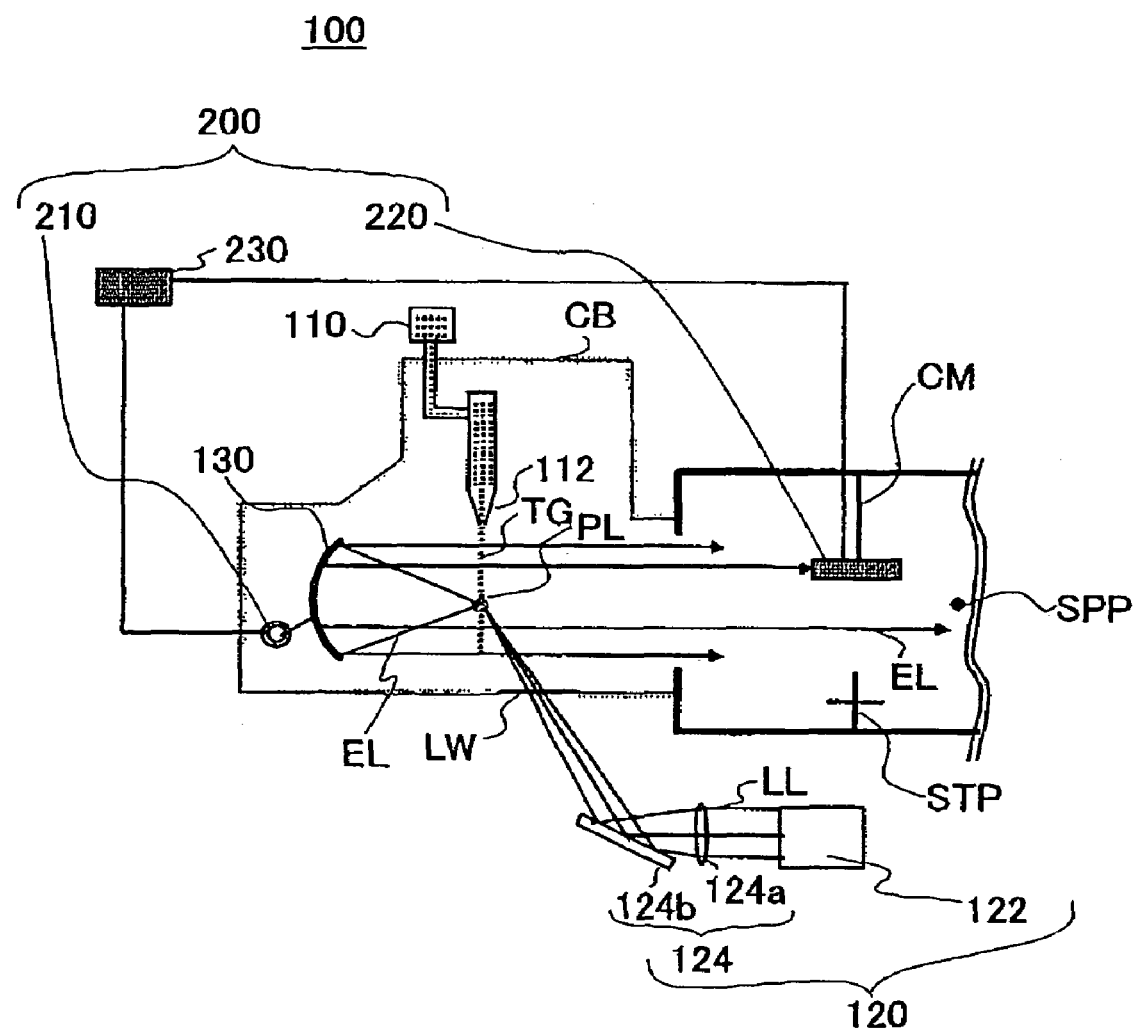
FIG. 1 is a schematic sectional view showing a structure of a light source unit according to one aspect of the present invention.

A description will now be given of a light source unit 100 according to one aspect of the present invention, with reference to the accompanying drawings. Like elements in each figure are designated by the same reference numerals, and a detailed description thereof will be omitted. FIG. 1 is a schematic sectional view showing a structure of the light source unit 100.

The light source unit 100 is a light source unit that irradiates a laser beam LL upon a target TG, generates plasma PL, and supplies EUV light EL radiated from the plasma PL. The light source unit 100 includes, as shown in FIG. 1, a target supply unit 110, a laser unit 120, an optical element 130, and a stabilizing means 200.

The target supply unit 110 supplies the target TG to a predetermined position of a chamber CG that is maintained in a vacuum or reduced pressure environment. The target supply unit 110 intermittently supplies the target TG in synchronization with emissions of the laser beam LL of the laser unit 120, which will be described later. The target TG liquid droplets in this embodiment is, but may be solid metal, such as copper, tin and aluminum, or Xe gas and cluster.

The laser unit 120 includes a laser generator 122 and a condenser 124, and serves to irradiate the laser beam LL upon the target TG and generate the plasma PL.

The laser generator 122 generates and emits the laser beam LL, which is a pulsed laser in this embodiment. The pulsed laser preferably has high repetitive frequency for increased average intensity of the EUV light EL radiated from the plasma PL (or target TG), and the laser generator 122 is driven at usually several kHz.

The condenser 124 includes a lens, a mirror, and a plane-parallel glass plate, and introduces the laser beam LL, which is emitted from the laser generator 122, into the chamber CB via a laser entrance window LW. The laser entrance window LW is used as part of a diaphragm of the chamber CB, and made of a material that transmits the laser beam LL. The condenser 124 includes a condenser lens 124a and a mirror 124b in this embodiment. The condenser 124 serves to condense the laser beam LL onto the target TG at a spot size and energy density necessary to generate the plasma PL.

The optical element 130 serves to condense the EUV light EL radiated from the plasma PL, and introduce the light to a supply point SPP that supplies the EUV light EL. In other words, the optical element 130 supplies the EUV light EL to the subsequent optical system at the supply point SPP, such as an illumination optical system in an exposure apparatus.

The optical element 130 is, for example, a multilayer coating mirror having a spheroid shape that has a focal point near the plasma PL and a multilayer coating that has a reflection enhancing effect on the reflecting surface. The optical element 130 supplies, as collimated light, the EUV light radiated from the plasma PL to the subsequent optical system without condensing the EUV light or forming a condensing point. The multilayer coating that reflects the EUV light having a wavelength of less than 20 nm includes, for example, a molybdenum (Mo)/silicon (Si) multilayer coating that alternately laminates twenty Mo and Si layers or a molybdenum (Mo)/beryllium (Be) multilayer coating that alternately laminates Mo and Be layers.

The stabilizing means 200 serves to maintain a positional relationship between a position of the supplied EUV light EL and a reference point STP for the supply point SPP. In other words, the stabilizing means 200 reduces fluctuations of the supply point SPP of the EUV light EL supplied from the light source unit 100. The reference point STP is provided in the subsequent optical system to which the light source unit 100 supplies the EUV light EL.

The stabilizing means 200 includes an adjusting means 210 that adjusts a position and angle of the optical element 130, a detecting means 220 that detects an angle at a detection point corresponding to a position of the EUV light EL supplied to the supply point SPP, a controller 230 that controls the adjusting means 210 based on the detection result by the detecting means 220. The "angle of the EUV light EL" and the "position (or positional offset) of the EUV light EL", etc., used in this embodiment refer to a "principal ray representative of the EUV light EL" unless otherwise specified.

The detecting means 220 is rigidly connected to the reference point STP (or the subsequent optical system to which the EUV light EL is supplied) via a connecting member CM. The controller 230 in this embodiment controls the adjusting means 210 based on the detection result by the detecting means 220 so as to maintain the positional relationship between the supply point SPP of the EUV light EL. The controller 230 has similar functions even in another stabilizing means, which will be described later. The controller 230 controls all necessary actions, such as calculations, to maintain the positional relationship between the supply point SPP of the EUV light EL and the reference point STP.

Figure 2:
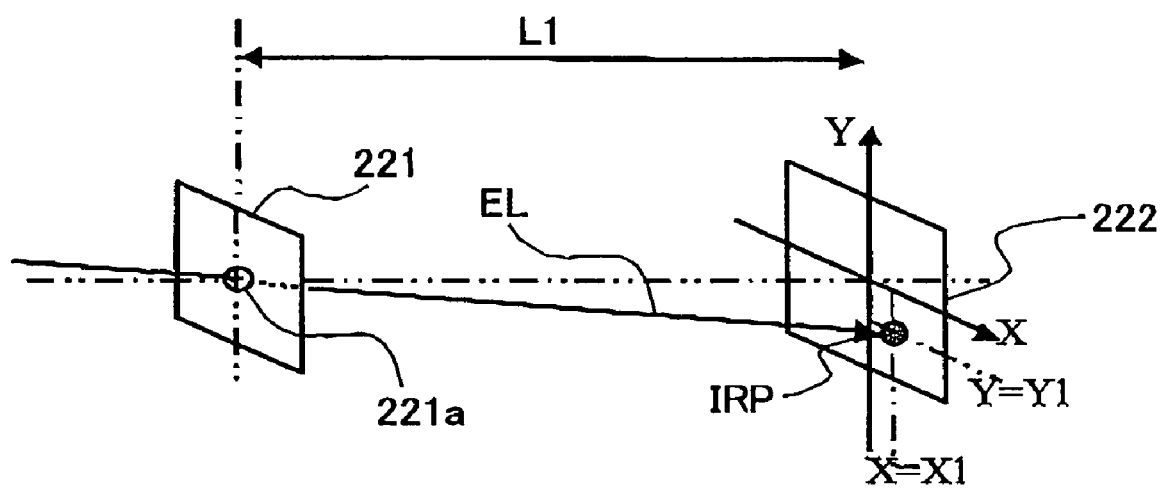
FIG. 2 is a schematic sectional view showing one exemplary structure of a detecting means shown in FIG. 1.

A concrete description will be given of the stabilizing means 200 with reference to FIGS. 2 to 7 and 24 and 25. FIG. 2 is a schematic perspective view showing one exemplary structure of the detecting means 220. The detecting means 220 includes, as shown in FIG. 2, a pinhole plate 221 and a two-dimensional sensor 222 in this embodiment.

Referring to FIG. 2, the EUV light EL reflected on the optical element 130 passes through a pinhole 221a in the pinhole plate 221 and is irradiated onto the two-dimensional sensor 222. The irradiating point on the two-dimensional sensor 222 on which the EUV light EL is irradiated is labeled IRP and a center position of the irradiating point IRP is labeled (X1, Y1).

Figure 3:
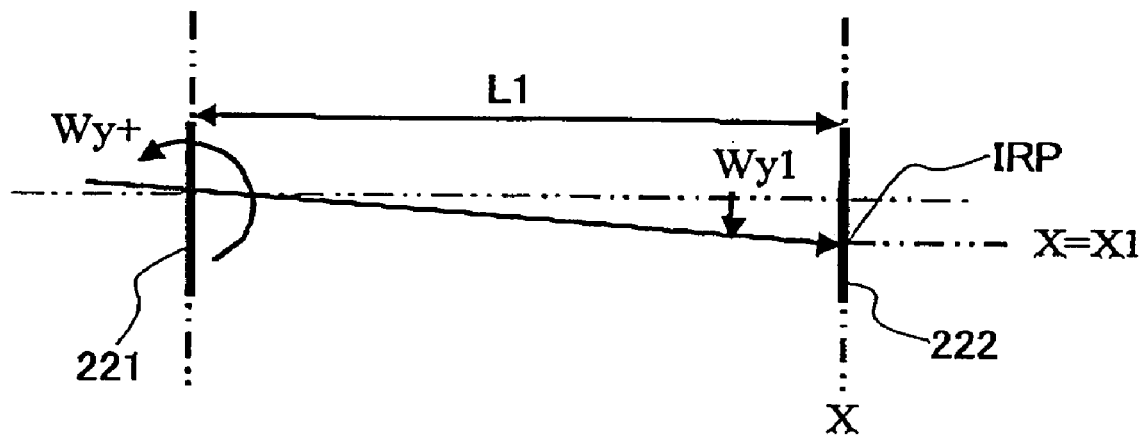
FIG. 3 shows the detecting means shown in FIG. 2 in an X-axis direction.

FIG. 3 shows the detecting means 220 shown in FIG. 2 in the X-axis direction. Referring to FIG. 3, angle Wy1 meets Wy1=−X1/L1, where L1 is a distance from the pinhole 221a in the pinhole plate 221 to the two-dimensional sensor 222, and a Wy+ direction in FIG. 3 is positive for the angle Wy1.

Figure 4:
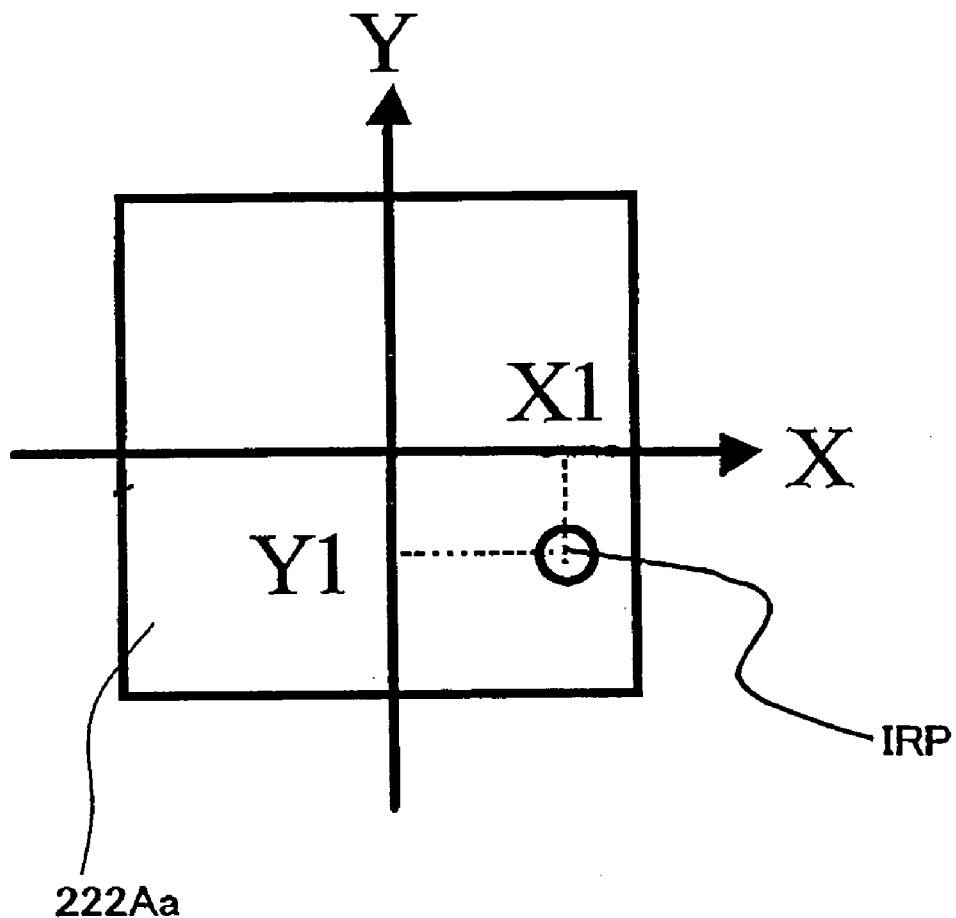
FIG. 4 is a schematic plane view of a two-dimensional CCD as one exemplary two-dimensional sensor shown in FIG. 2.

FIG. 4 is a schematic plane view showing a two-dimensional CCD 222A as one exemplary two-dimensional sensor 222. Referring to FIG. 4, the two-dimensional CCD 222A arranges hundreds thousand or million pixels 222Aa, and calculates the center position (X1, Y1) of the irradiating point IRP by processing an output from each pixel.

Figure 5:
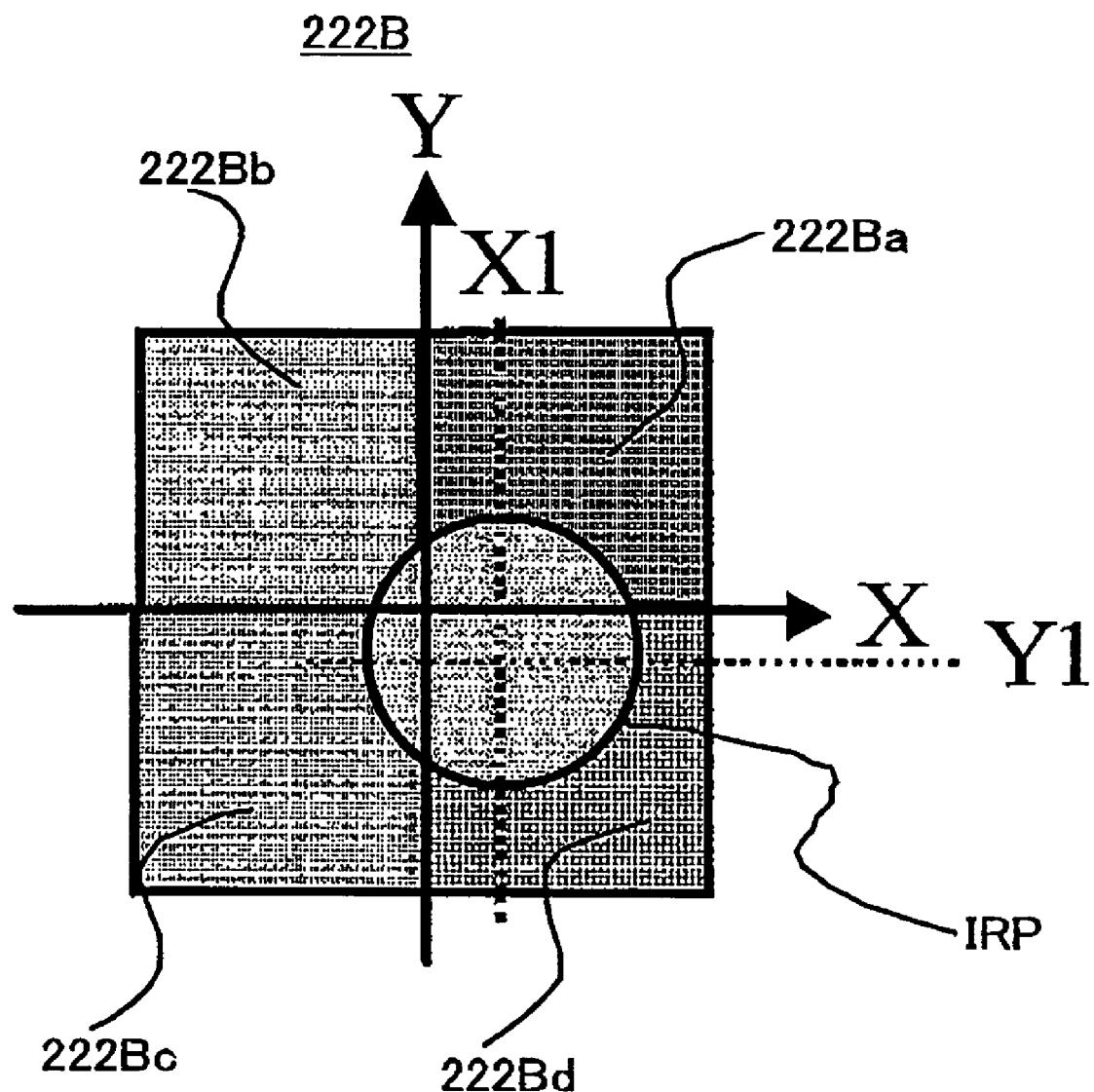
FIG. 5 is a schematic plane view of a four-section sensor as one exemplary two-dimensional CCD shown in FIG. 2.

FIG. 5 is a schematic plane view of the four-section sensor 222B as one exemplary two-dimensional sensor 222. Referring to FIG. 5, the four-section sensor 222B includes four sensors 222Ba, 222Bb, 222Bc, and 222Bd. For example, suppose that Ea is the energy irradiated onto the sensor 222Ba, Eb is the energy irradiated onto the sensor 222Bb, Ec is the energy irradiated onto the sensor 222Bc, and Ed is the energy irradiated onto the sensor 222Bd. Then, when a relationship among the position (X, Y) of the EUV light EL, P=(Ea+Eb−Ec−Ed)/(Ea+Eb+Ec+Ed), and Q=(Ea+Ed−Eb−Ec)/(Ea+Eb+Ec+Ed) is previously obtained by moving the four-section sensor 222B relative to the EUV light EL, a relationship between P=P(x, y) and Q=Q(x, y) can be obtained. Therefore, the center position (X, Y) of the irradiating point IRP on the four-section sensor 222B can be calculated from values of P and Q The detecting means 220 that includes the pinhole plate 221 and two-dimensional sensor 222 is thus rigidly connected to the reference position STP via the connecting member CM, and precisely detects angular changes of the EUV light EL at the detecting position and ultimately positional changes of the supply point SPP, when the position of the light source unit 100 fluctuates relative to the subsequent optical system.

Figures 24A, 24B, 24C, 24D:
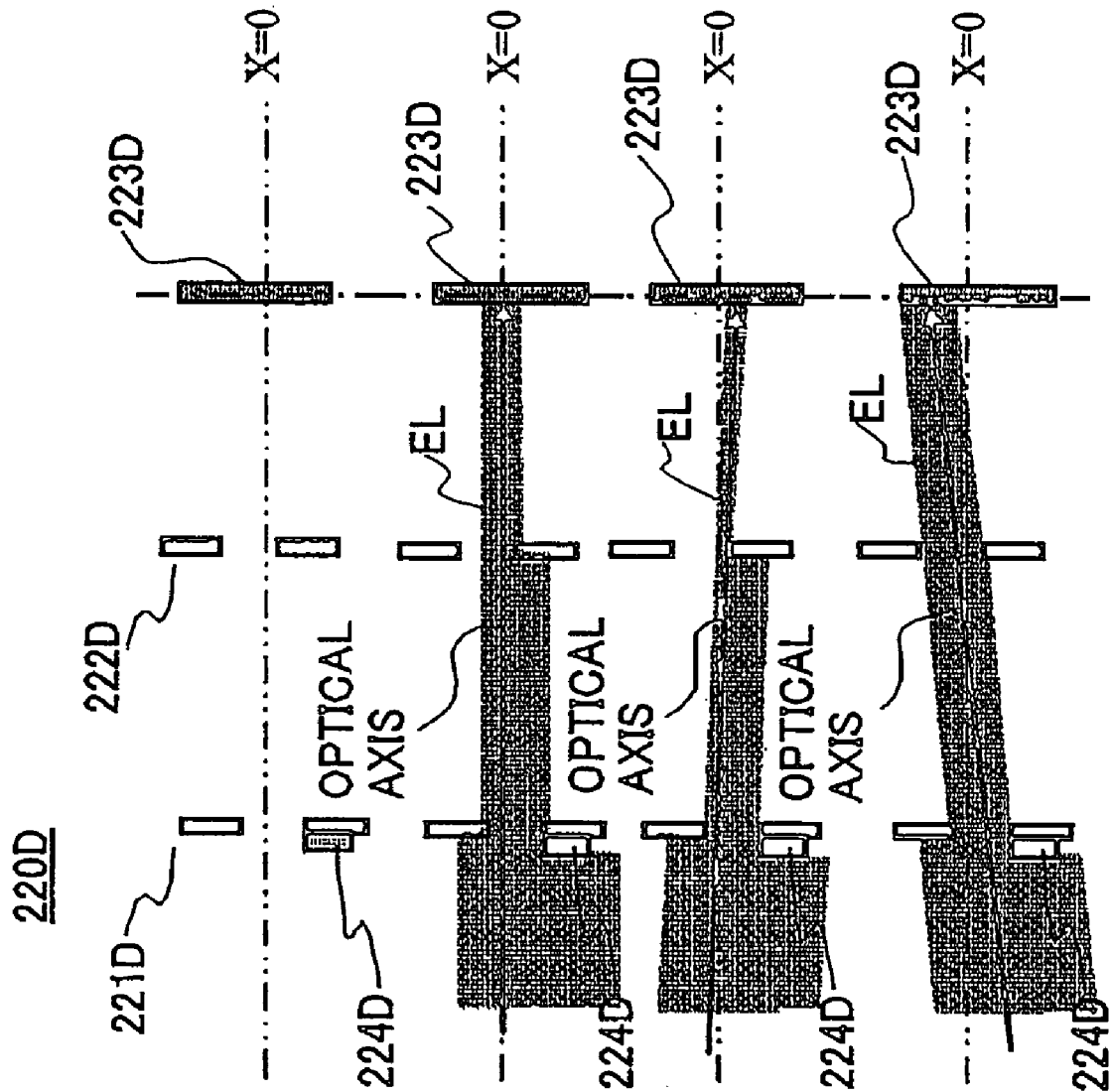
FIGS. 24A, 24B, 24C, and 24D are schematic sectional views showing a structure of another modification of the detecting means shown in FIG. 2.

FIG. 24 is a schematic sectional view of the structure of a detecting means 220D as another variation of the detecting means 220 shown in FIG. 2. While the detecting means 220 shown in FIG. 2 detects an angle of the EUV light EL by a combination of the pinhole plate 221 and the two-dimensional sensor 222, the detecting means 220D includes, as shown in FIG. 24, a first slit 221D, a second slit 222D, a first light intensity sensor 223D, and a second light intensity sensor 222D provided in front of the first slit 221D. As shown in FIG. 24A, the first slit 221D and second slit 222D offset perpendicularly to the optical axis of the light source unit 100 (which is indicated by two-dotted line in FIG. 24).

The first slit 221D and second slit 222D arranged as shown in FIG. 24A enable an angle of the EUV light EL to be detected by utilizing changes of the light intensity of the EUV light EL incident upon the first light intensity sensor 223D, for example, when the EUV light EL is incident perpendicularly upon the first light intensity sensor 223D and the second light intensity sensor 224D as shown in FIG. 24B, and when the EUV light EL is incident obliquely upon the first light intensity sensor 223D and the second light intensity sensor 224D as shown in FIGS. 24C and 24D.

When only the first light intensity sensor 223 is used for detection, a change of the entire light intensity of the EUV light EL has no difference from the angular change of the second light intensity sensor 224D. In this case, an angle of the EUV light E1 can be calculated by normalizing the light intensity by using the second light intensity sensor 224D. For example, an angle of the EUV light EL can be calculated from an output of E1/E2, where E1 is an output from the first light intensity sensor 223D, E2 is an output from the second light intensity sensor 224D, and a relationship between an angle and E1/E2 is previously obtained by changing the angle of the EUV light EL.

Figure 25:
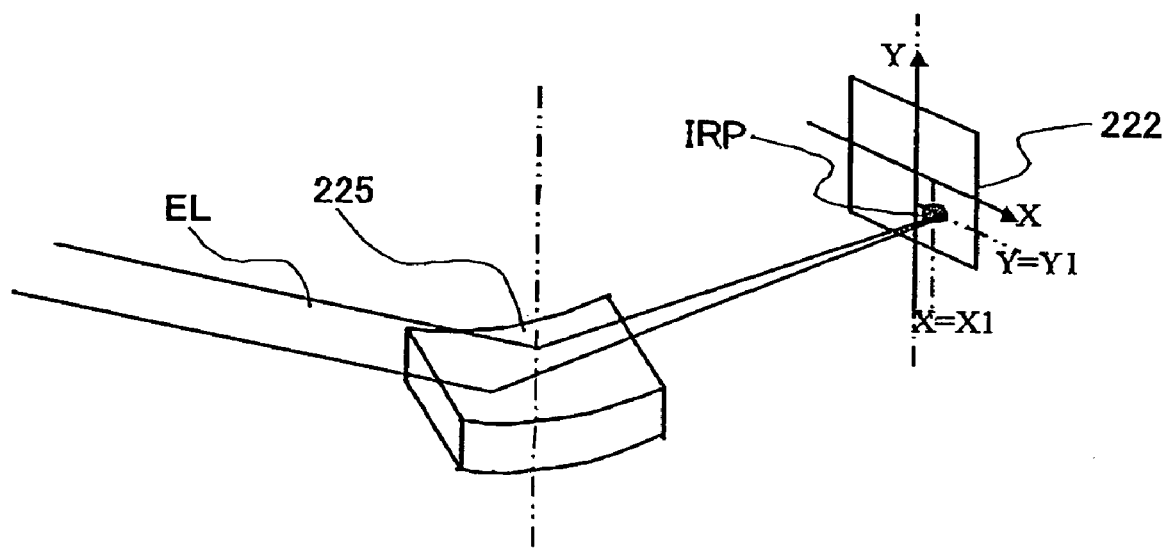
FIG. 25 is a schematic sectional view showing another structure of the detecting means shown in FIG. 2.

FIG. 25 is a schematic sectional view of another structure of the detecting means 220. While the detecting means shown in FIG. 2 includes the pinhole plate 221 and two-dimensional sensor 222, this embodiment uses a concave mirror 225 and the two-dimensional sensor 222 for the detecting means 220.

Referring to FIG. 25, the EUV light EL images on the concave mirror 225, and forms the irradiating point IRP on the two-dimensional sensor 222. An angle of the EUV light EL is detected from a position of the irradiating point IRP when the coordinate or position of the irradiating point IRP is previously obtained at different angles, for example, by changing an angle of the EUV light EL.

Figure 6:
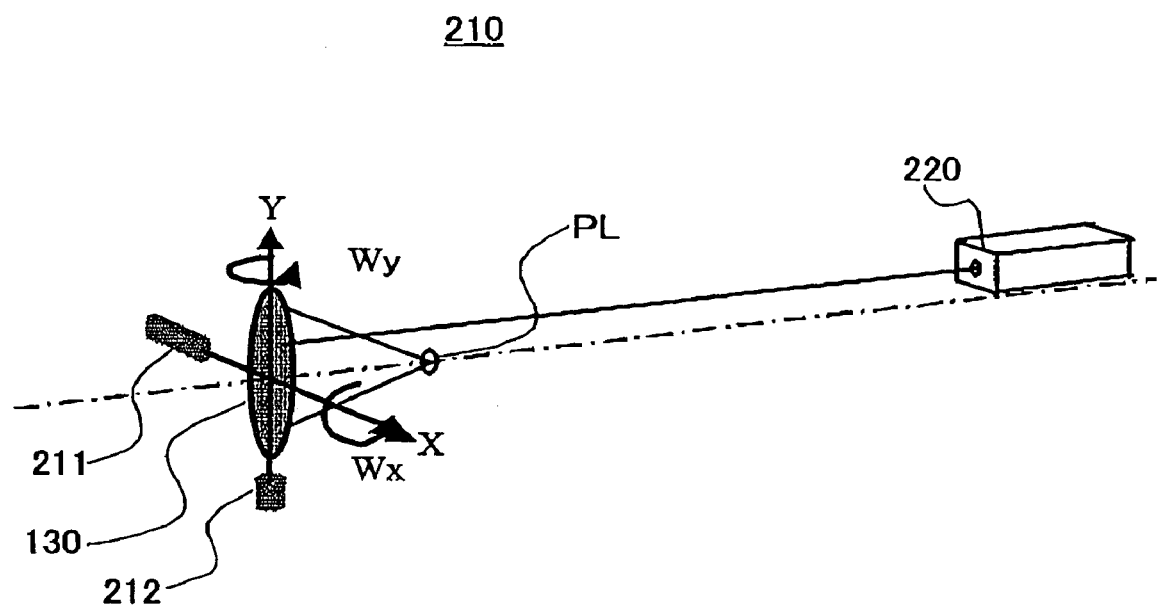
FIG. 6 is a schematic perspective view showing one exemplary structure of an adjusting means shown in FIG. 1.

FIG. 6 is a schematic perspective view of one exemplary structure of the adjusting means 210. Referring to FIG. 6, the adjusting means 210 includes a driving mechanism 211 for rotationally driving the optical element 130 in a Wx direction, and a driving mechanism 212 for rotationally driving the optical element in a Wy direction. The adjusting means 210 freely changes an angle of the EUV light EL by driving the optical element 130.

Figure 7:
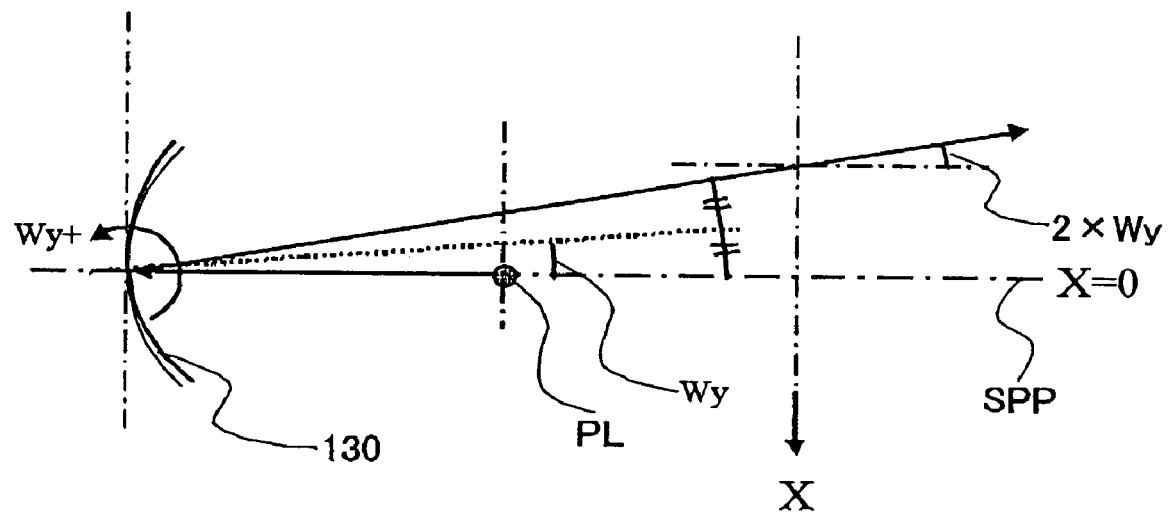
FIG. 7 is a view for explaining concrete driving of an optical element based on a detection result by the detecting means.

FIG. 7 is a view for explaining concrete driving of the optical element 130 based on the detection result of the detecting means 220. FIG. 7 shows a driving mechanism only around the Y-axis for simple description. Suppose that Wy1 is an angle of the EUV light EL in FIGS. 2 and 3, Wy is a rotation of the optical element 130 around the Y-axis in FIG. 7, and ΔWy is a driving amount for driving the optical element 130. Then, the EUV light EL is returned to the supply point SPP when the optical element 130 is driven by ΔWy=1/2×Wy1. Similarly, suppose that ΔWx is a driving amount of the optical element 130 where Wx is a rotation around the X-axis. Then, the EUV light EL is returned to the supply point SPP when the optical element 130 is driven by ΔWx=1×Wx1. When the EUV light EL cannot be returned to the supply point SPP even when the optical element 130 is driven once, the driving amounts ΔWx and ΔWy are calculated from the center position (X1, Y1) of the irradiating position IRP, and the optical element 130 is driven repeatedly.

Figure 8:
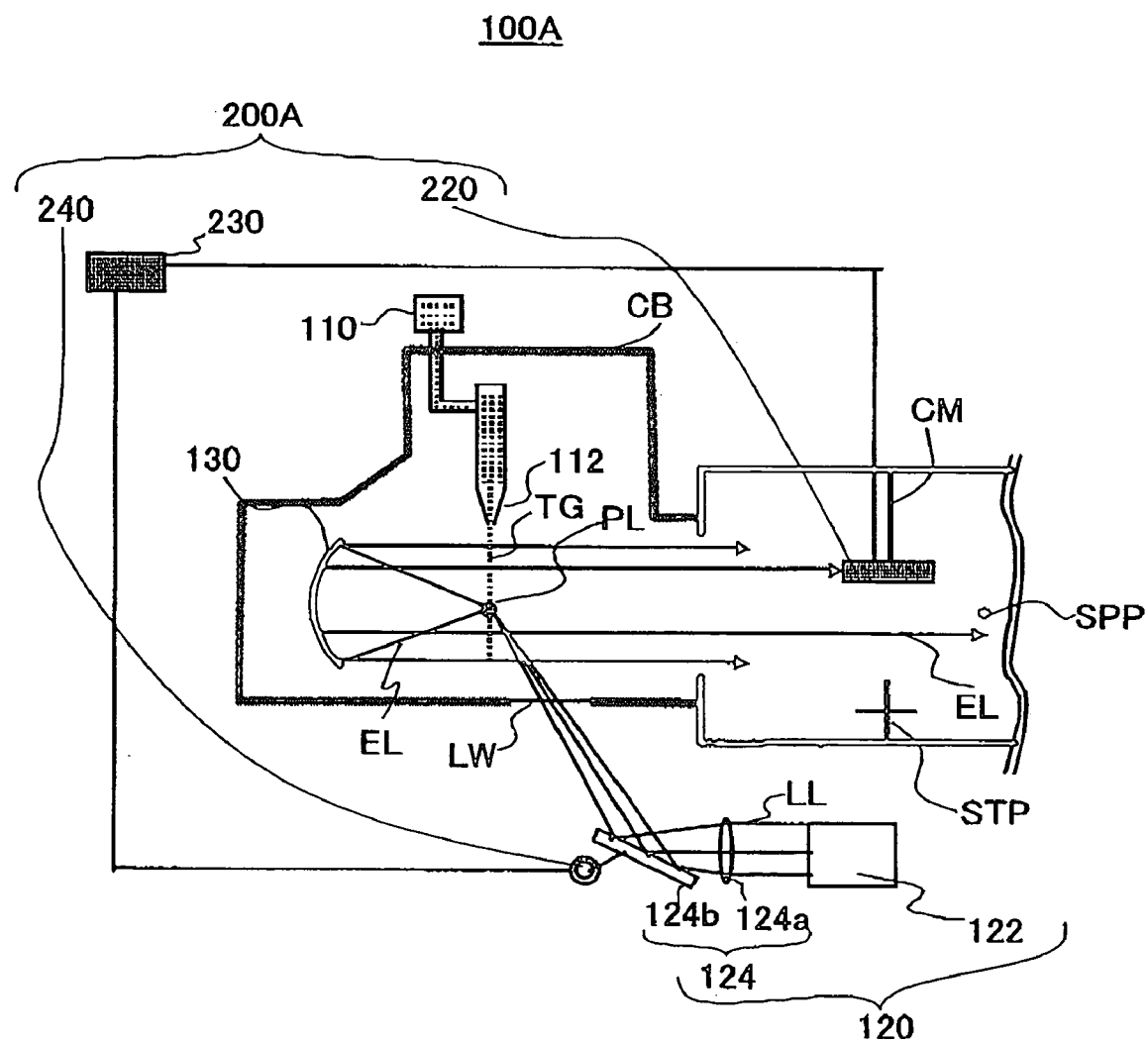
FIG. 8 is a schematic sectional view showing a structure of a modification of the light source unit shown in FIG. 1.
Figure 9:
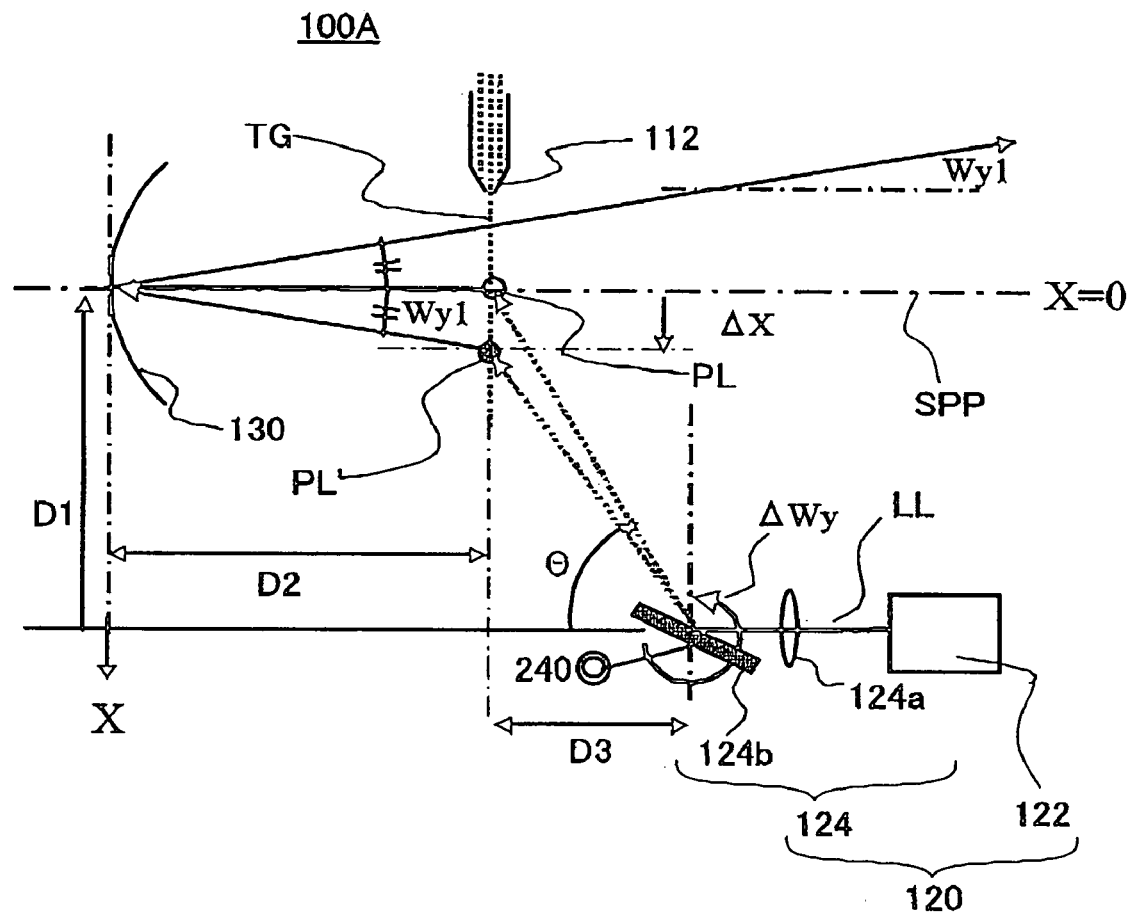
FIG. 9 is a schematic sectional view showing principal part of the light source unit shown in FIG. 8.

Referring now to FIGS. 8 and 9, a description will be given of the light source unit 100A as a variation of the light source unit 100. FIG. 8 is a schematic sectional view showing a structure of the light source unit 100A. The light source unit 100A is similar to the light source unit 100 except for the structure of a stabilizing means 200A. The stabilizing means 200A a detecting means 220, a controller 230, and an adjusting means 240 in this embodiment includes. The adjusting means 240 includes an X-axis stage that rotates the mirror 124b around the X-axis and a Y-axis stage that rotates the mirror 124b around the Y-axis so that each stage drives independently.

FIG. 9 is a schematic sectional view of the principal part of the light source unit 100A shown in FIG. 8. In FIG. 9, the target TG is supplied parallel to the X-axis for simple description. In FIG. 9, D1 denotes a designed distance from the mirror 124b to the generating point of the EUV light EL (or the plasma PL) in the X-axis direction. D2 denotes a designed distance from the generating point of the EUV light EL (or the plasma PL) to the optical element 130 in the Y-axis direction. D3 denotes a designed distance in the Y-axis direction from the mirror 124b to the generating point of the EUV light EL (or the plasma PL).

Equation 1 gives a designed angle θ between the X-axis and the optical axis of the laser beam LL:

$$\tan\theta = D1/D3 \quad \text{[EQUATION 1]}$$

Accordingly, the distance D1 is given by Equation 2 below:

$$D1 = \tan\theta \times D3 \quad \text{[EQUATION 2]}$$

An angle of the EUV light is changed when a position of the generating point of the EUV light EL (or the plasma PL) is moved by ΔX (to a position of the plasma PL'). ΔWy that meets Equation 3 below is calculated and the mirror 124b may be driven based on the driving amount ΔWy, where ΔWy is a driving amount of the mirror 124b:

$$D1 - \Delta X = D3 \times \tan(\theta - 2 \times \Delta Wy) \quad \text{[EQUATION 3]}$$

Equation 3 multiplies ΔWy by 2 because as the mirror 124b moves by ΔWy, the optical axis of the laser beam LL reflected on the mirror 124b moves by the double angles.

Equation 5 below is obtained when Equation 4 below is solved, which is a modification of Equation 3 on the assumption that ΔX/D3 and ΔWy are sufficiently smaller than 1 (i.e., ΔX/D3<<1 and ΔWy<<1):

$$\tan(\theta - 2 \times \Delta Wy) = (D1 - \Delta X)/D3 \quad \text{[EQUATION 4]}$$

$$\Delta Wy = 1/2 \times (1/(1 + \tan^2\theta) \times \Delta X/D3) \quad \text{[EQUATION 5]}$$
$$= 1/2 \times \cos^2\theta \times \Delta X/D3)$$

Accordingly, the mirror 124b may be driven by the driving amount ΔWy.

When the EUV light EL inclines relative to the supply point SPP, Wy1 is expressed by Equation 6 below:

$$Wy1 = \Delta X/D2 \quad \text{[EQUATION 6]}$$

Accordingly, the mirror 124b is driven by the driving amount ΔWy that satisfies Equation 7 below:

$$\Delta Wy = 1/2 \times \cos^2\theta \times D2 \times Wy1/D3 \quad \text{[EQUATION 7]}$$

Driving of the mirror 124b has been thus described in the Wy direction when the EUV light EL shifts in the X-axis direction from the supply point SPP. When the EUV light EL shifts in the Y-axis direction relative to the supply point SPP, the mirror 124b may be similarly driven in the Wx direction based on the driving amount ΔWx that satisfies Equation 8 below:

$$\Delta Wx = 1/2 \times \cos^2\theta \times D2 \times Wx1/D3 \quad \text{[EQUATION 8]}$$

Figure 10:
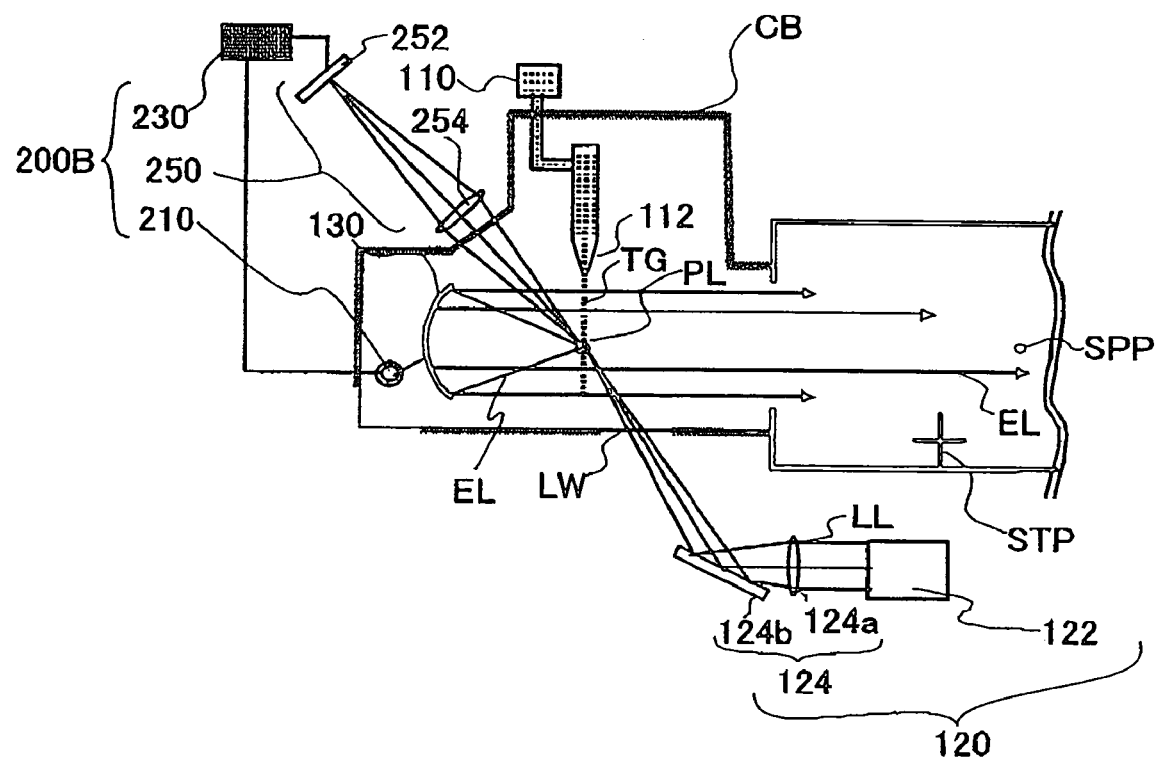
FIG. 10 is a schematic sectional view showing a structure of a modification of the light source unit shown in FIG. 1.

Changing of the target TG position provides similar effects although it is not discussed in detailed in this embodiment Referring now to FIGS. 10 and 12, a description will be given of a light source unit 100B as a variation of the light source unit 100. FIG. 10 is a schematic sectional view of the structure of the light source unit 100B. The light source unit 100B is similar to the light source unit 100 shown in FIG. 1 except for the structure of the stabilizing means 200B. The stabilizing means 200B includes the adjusting means 210, the controller 230, and a detecting means 250 in this embodiment. The detecting means 250 includes a sensor 252 that detects the EUV light EL from the plasma PL, and an optical element 254 that images the EUV light EL onto the sensor 252, and detects a position of the plasma (or a generating point of the EUV light EL). The optical element 254 is a convex lens in this embodiment, but may use a concave mirror for similar effects.

The light source unit 100B thus detects a position of the plasma PL using the detecting means 250. The controller 230 stores data relating to how the optical element 130 is driven when the optical axis of the EUV light EL offsets from the supply point SPP, and drives the optical element 130 based on the data, maintaining a positional relationship between the angle of the EUV light EL and the reference point STP.

Figure 11:
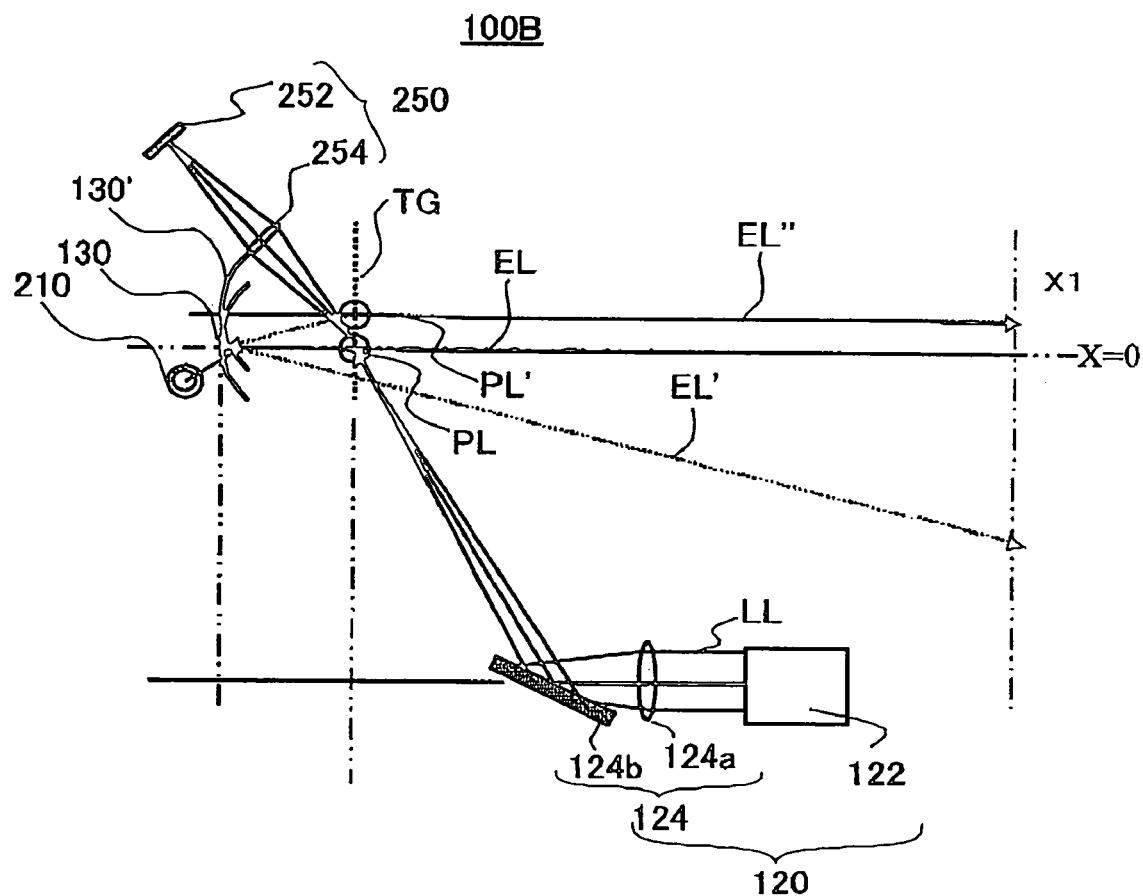
FIG. 11 is a schematic sectional view showing principal part of the light source unit shown in FIG. 10.

FIG. 11 is a schematic sectional view of the principal part of the light source unit 100B shown in FIG. 10. In FIG. 11, the detecting means 250 detects that a position of the plasma PL has moved to a position of the plasma PL'. Thereby, the EUV light EL turns to the EUV light EL' generated from the plasma PL', and changes its angle as shown in FIG. 11. In this case, an angle of the EUV light EL' is changed and the EUV light EL' is returned to the EUV light EL" having a predetermined angle by driving the optical element 130 via the adjusting means 210, and by changing its orientation like the optical element 130'.

Figure 12:
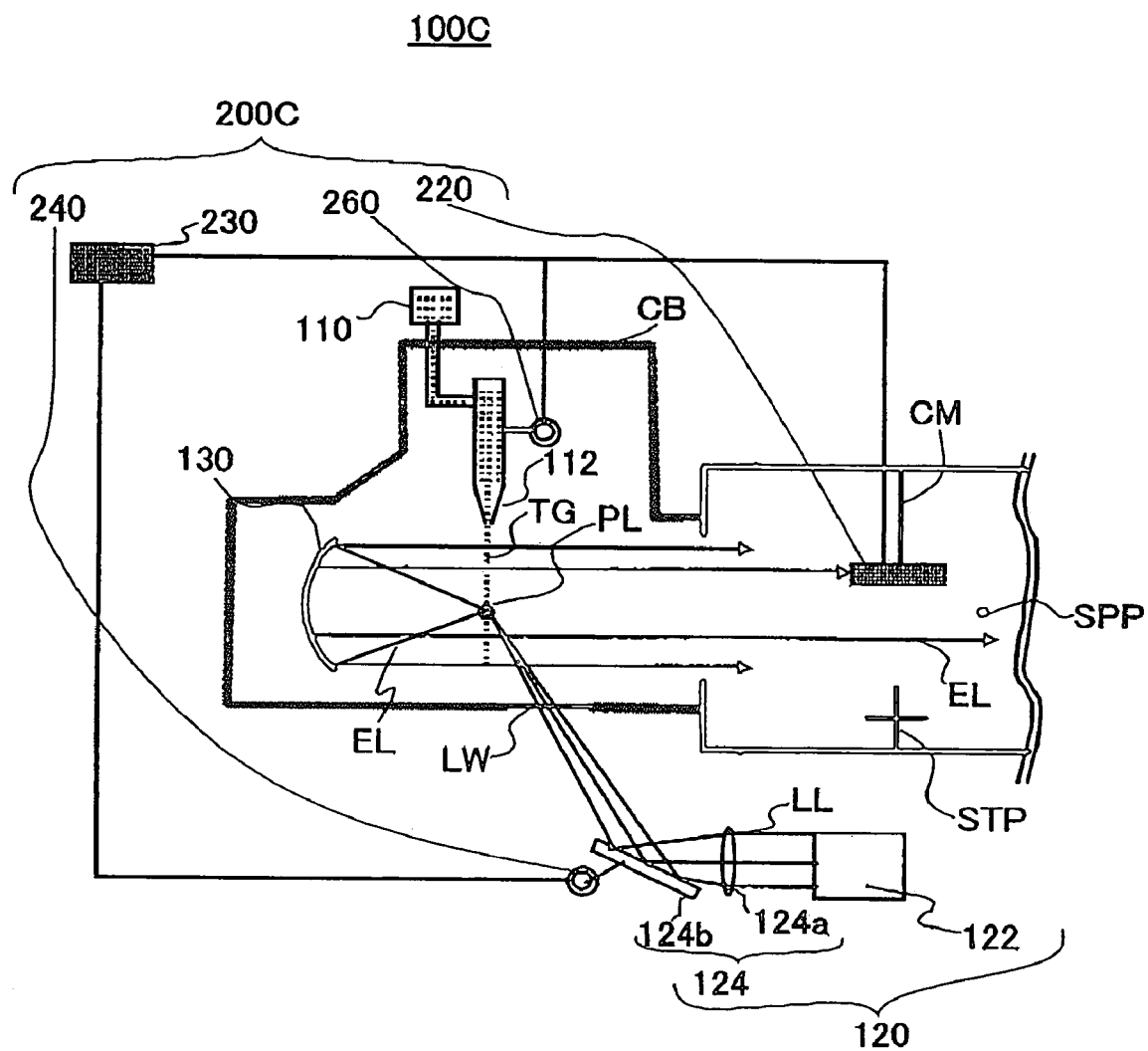
FIG. 12 is a schematic sectional view showing a structure of a modification of the light source unit shown in FIG. 8.

Referring now to FIGS. 12 and 13, a description will be given of a light source unit 100C as a variation of the light source unit 100A. FIG. 12 is a schematic sectional view of the structure of the light source unit 100C. The light source unit 100C is similar to the light source unit 100A shown in FIG. 8 except for the structure of the stabilizing means 200C. The stabilizing means 200C includes the detecting means 220, the controller 230 and adjusting means 240 and 260 in this embodiment. The adjusting means 260 serves to adjust a position and/or angle of the target supply unit 110. In other words, the adjusting means 260 can change a position of the target TG supplied to the chamber CB. The adjusting means 260 is implemented, for example, as a six-axis stage having the X-axis, Y-axis, Z-axis and directions around these axes. For a simple structure, the adjusting means 260 may be the three-axis stage having directions around the X-axis, the Y-axis and the Z-axis.

Figure 13A:
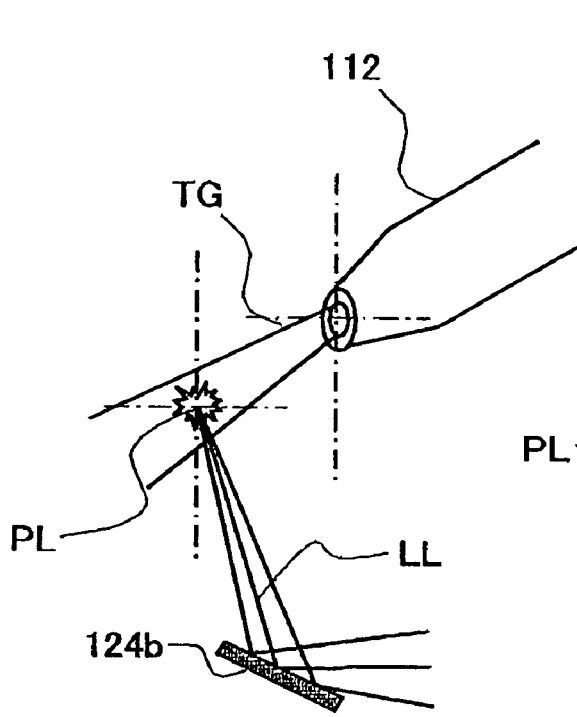
FIGS. 13A and 13B are schematic sectional views showing principal part of the light source unit shown in FIG. 12.
Figure 13B:
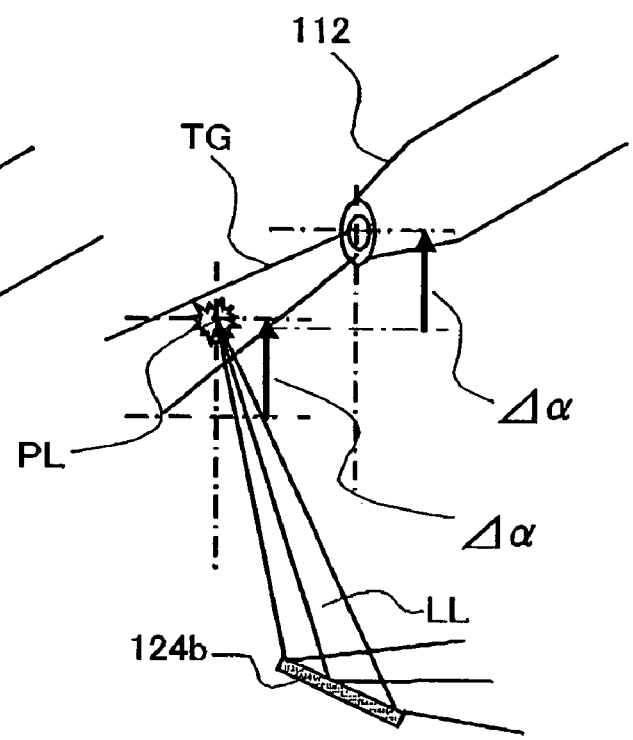

FIG. 13 is a schematic perspective view of the principal part of the light source unit 100C shown in FIG. 12. As shown in FIG. 13A, the EUV light EL is stabilized when the laser beam LL is irradiated so that the condensing point is placed on the target TG. However, as described above, as the adjusting means 240 drives the mirror 124b, the condensing point is not always located on the target TG. Accordingly, when the adjusting means 240 drives the mirror 124b and a condensing point of the laser beam LL shifts by $\Delta\alpha$, the adjusting means 260 drives the target supply unit 110 and moves a position of the target TG by a distance $\Delta\alpha$, as shown in FIG. 13B, stabilizing the EUV light EL.

Figure 14:
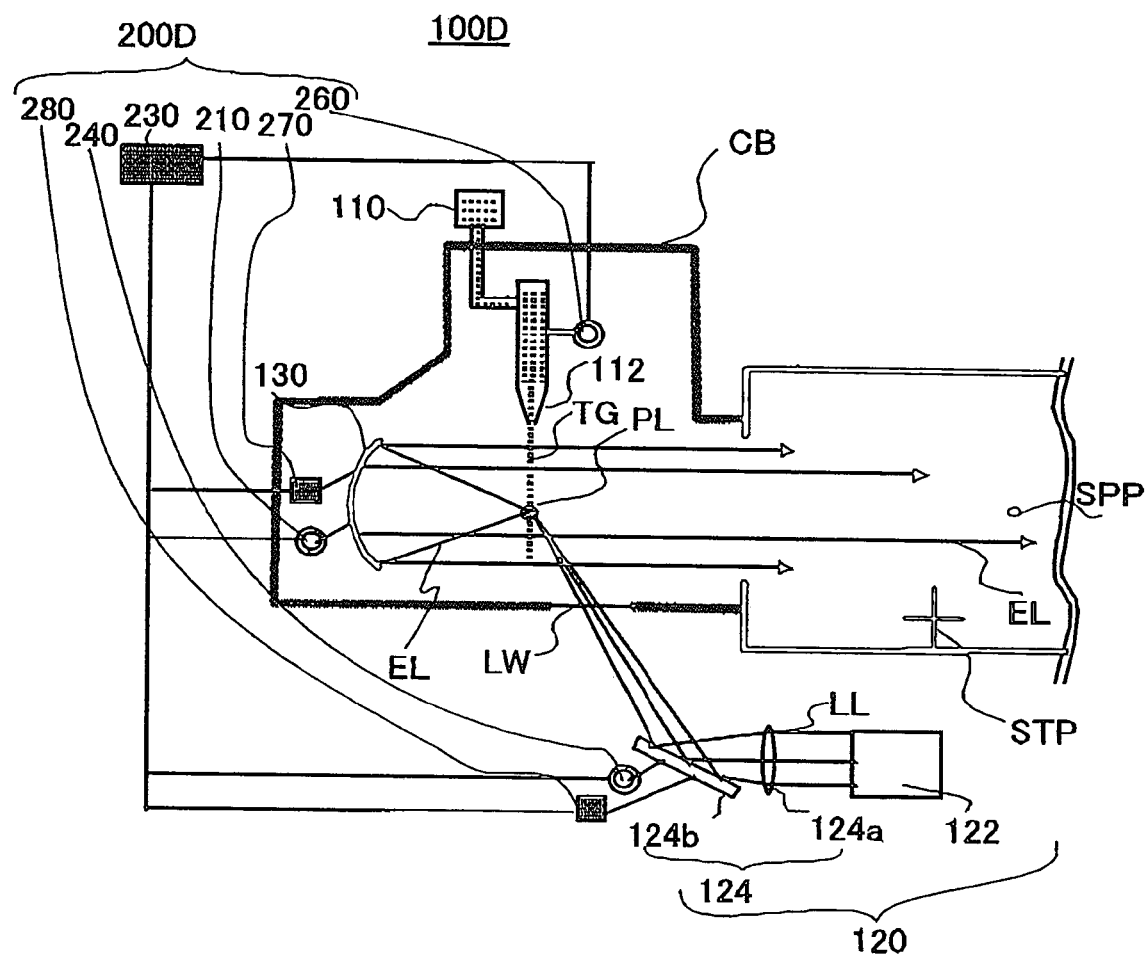
FIG. 14 is a schematic sectional view showing a structure of a modification of the light source unit shown in FIG. 10.
Figure 15:
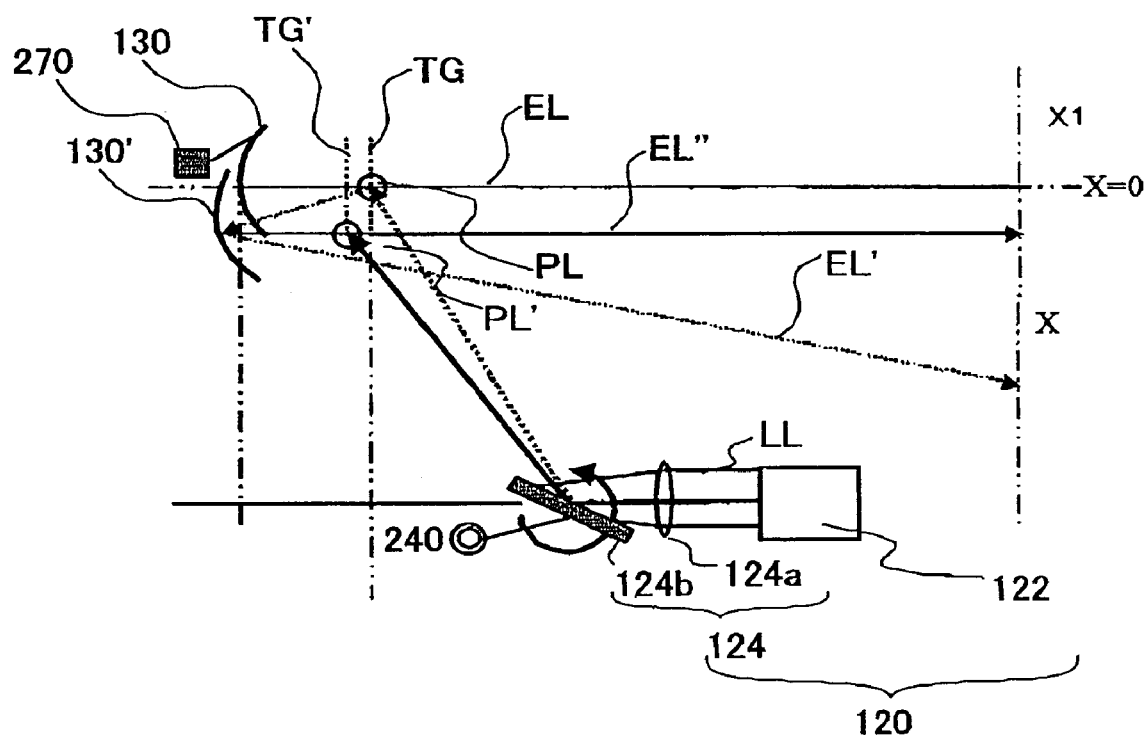
FIG. 15 is a schematic sectional view showing principal part of the light source unit shown in FIG. 14.

Referring now to FIGS. 14 and 15, a description will be given of a light source unit 100D as a variation of the light source unit 100B. FIG. 14 is a schematic sectional view of a structure of the light source unit 100D. The light source unit 100D is similar to the light source unit 100B shown in FIG. 10 except for the structure of the stabilizing means 200D. The stabilizing means 200D includes the adjusting means 210, 240 and 260, the controller 230, the detecting means 270 and 280 in this embodiment. The detecting means 270 serves to detect a position and/or angle of the optical element 130. The detecting means 280 serves to detect a position and/or angle of the mirror 124b. An illustrative and conceivable detecting method includes a method of reading a position and angle of an encoder attached to a guide portion, and a method of measuring a distance-measuring sensor a distance between the rear surface of the mirror and the reference surface at plural points.

The light source unit 100D drives at least one of the adjusting means 210, 240 and 260 based on the detection results by the detecting means 270 and/or 280, and maintains the angle of the EUV light EL relative to the reference point STP.

FIG. 15 is a schematic sectional view of the principal part of the light source unit 100D shown in FIG. 14. Suppose that when the position and angle of the optical element 130 fluctuate, how the generating point of the EUV light EL (or the position of the plasma PL) is driven is known. Referring to FIG. 15, the detecting means 270 detects that the position of the optical element 130 has moved to the position of the optical element 130'. The EUV light EL becomes the EUV light EL' at the position of the optical element 130' and fluctuates. Since it is known that a position of the EUV light EL' returns to the predetermined position by changing a position of the plasma PL to the position of the plasma PL', the adjusting means 240 properly drives the mirror 124b and returns to the predetermined EUV light EL". In this case, the EUV light EL" can be stably generated by moving the position of the target TG to the position of the target TG'.

While the embodiment in FIG. 15 maintains the EUV light EL in place by driving an element other than the optical element 130 as the optical element 130 fluctuates, driving the optical element 130 and the target supply unit 110 (or the position of the target TG) provide similar effects, for example, when the mirror 124b moves.

Figure 16:
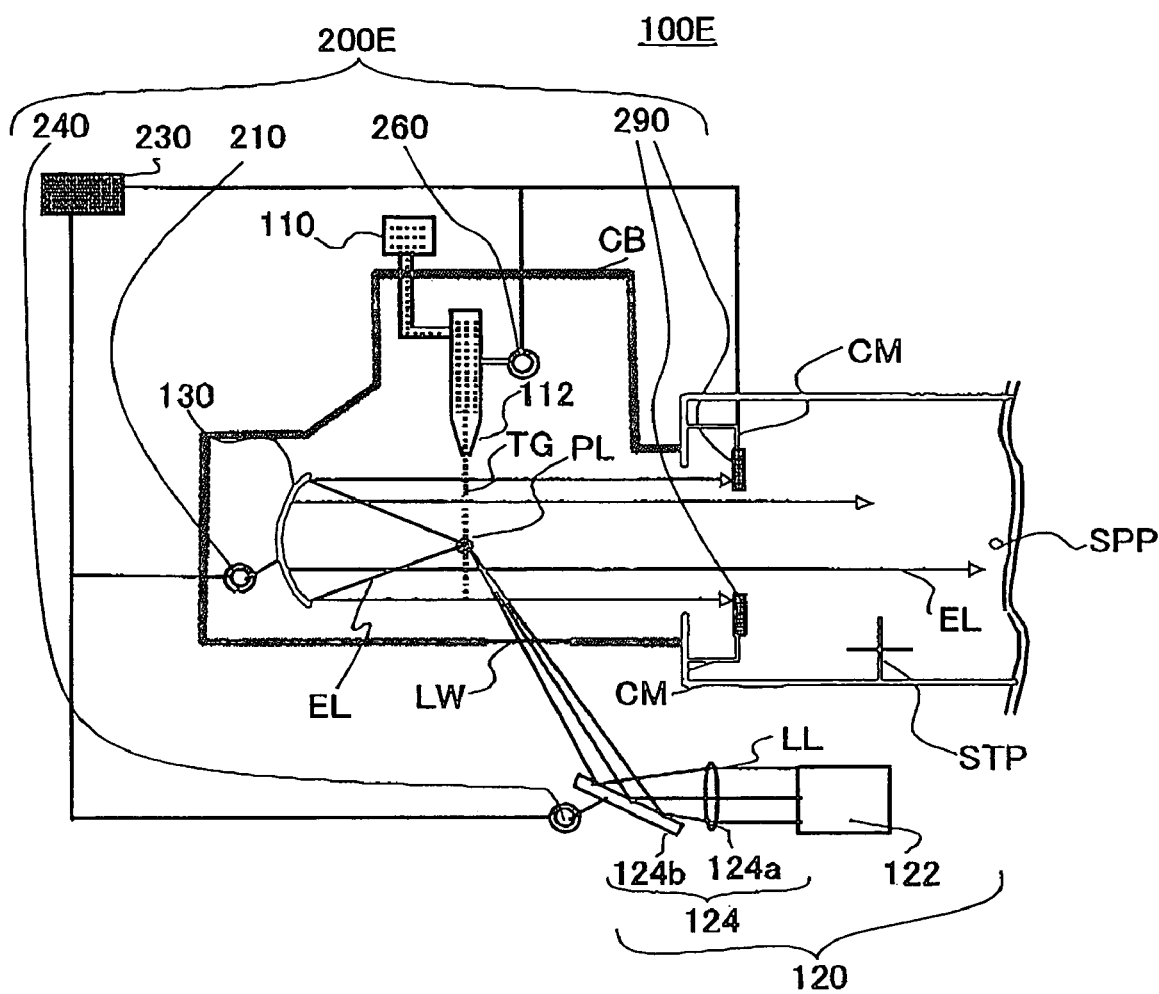
FIG. 16 is a schematic sectional view showing a structure of as a modification of the light source unit shown in FIG. 1.

Referring now to FIGS. 16 to 23, a description will be given of a light source unit 100E as a variation of the light source unit 100. FIG. 16 is a schematic sectional view of the structure of the light source unit 100E. The light source unit 100E is similar to the light source unit 100 except for the optical element 130A and the stabilizing means 200E.

The optical element 130A includes a spheroid multilayer coating mirror having a first focal point near the plasma PL, and once condenses the EUV light near a second focal point FP in this embodiment.

The stabilizing means 200E includes the adjusting means 210, 240 and 260, the controller 230 and a detecting means 290 in this embodiment. The detecting means 290 serves to detect a position of the EUV light EL. A description will be given of the concrete structure etc. of the detecting means 290 later.

The light source unit 100E drives one or both of the mirror 124b and optical element 130A via the target supply unit 110 and the adjusting means 210, 240 and 260 based on the position of the EUV light EL detected by the detecting means 290, and maintains the position of the EUV light EL in place relative to the reference point STP.

Figure 17:
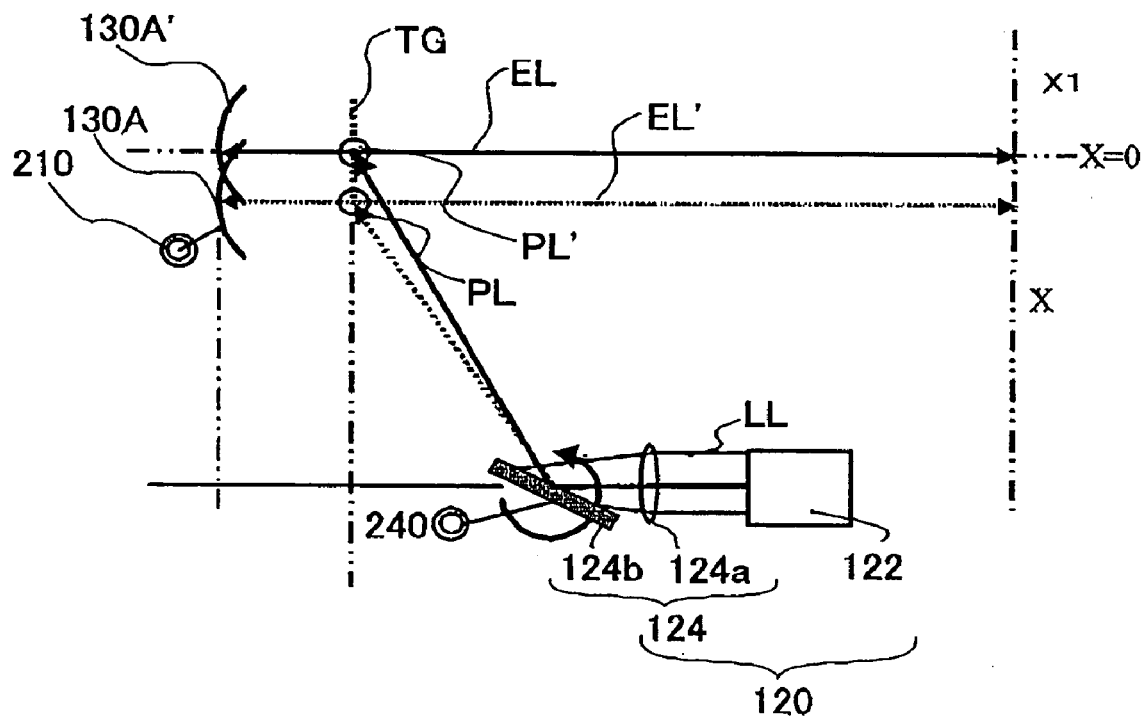
FIG. 17 is a schematic sectional view showing principal part of the light source unit shown in FIG. 16.

FIG. 17 is a schematic sectional view showing the principal part of the light source unit 100E shown in FIG. 16. In FIG. 17, the detecting means 290 detects the EUV light EL' offset from the predetermined position. In this case, a position of the EUV light EL' returns to the position of the EUV light EL (or the predetermined position) by moving a position of the optical element 130 to the position of the optical element 130' and by driving a position of the plasma PL (or a generating point of the EUV light EL) to the plasma PL'.

Figure 18:
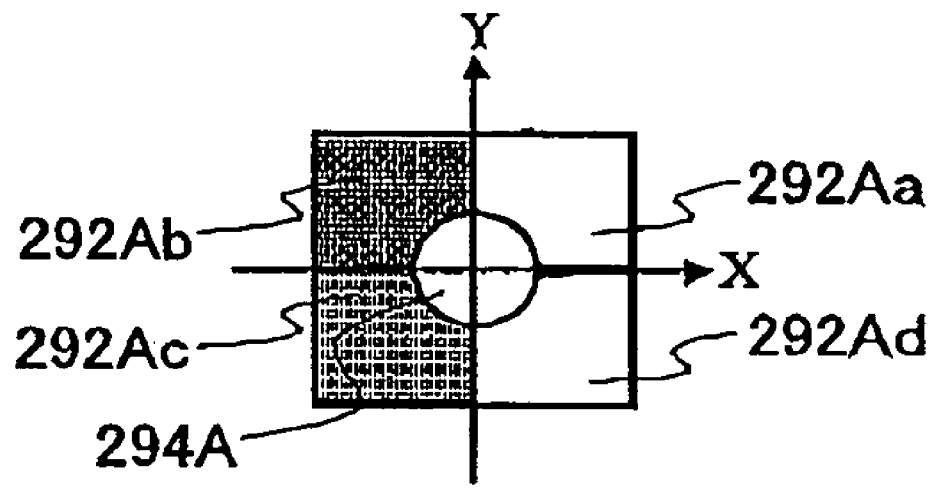
FIG. 18 is a schematic plane view showing a four-section sensor as one exemplary detecting means shown in FIG. 16.

A description will now be given of the detecting means 290. FIG. 18 is a schematic plane view of a four-section sensor 290A as one exemplary detecting means 290. Referring to FIG. 18, the four-section sensor 290A has four sensors 292Aa, 292Ab, 292Ac and 292Ad, and a pinhole 294A at the center. The pinhole 294A has, for example, a size that enables the EUV light EL enough for the exposure to pass through it and that enables a fluctuation of the position of the EUV light EL to be detected. For example, when the EUV light EL has a light intensity distribution that has Gaussian distribution shape, a position of the EUV light EL can be detected without affecting the transmitting light intensity of the EUV light EL if a diameter of the pinhole 294A is set to about $6\sigma$ where $\sigma$ is an amount that defines a spread of Gaussian distribution.

Figure 19:
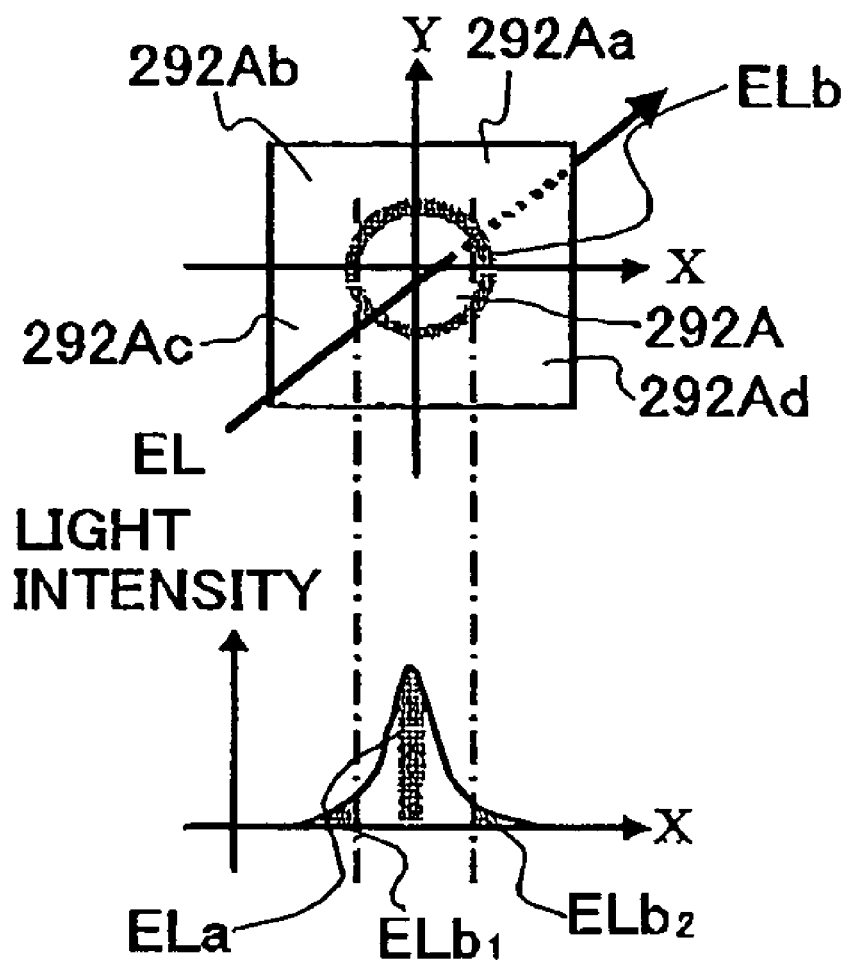
FIG. 19 is a view showing a positional relationship between (a pinhole in) the four-section sensor shown in FIG. 18 and the EUV light, and the light intensity of the EUV light detected by the four-section.
Figure 20:
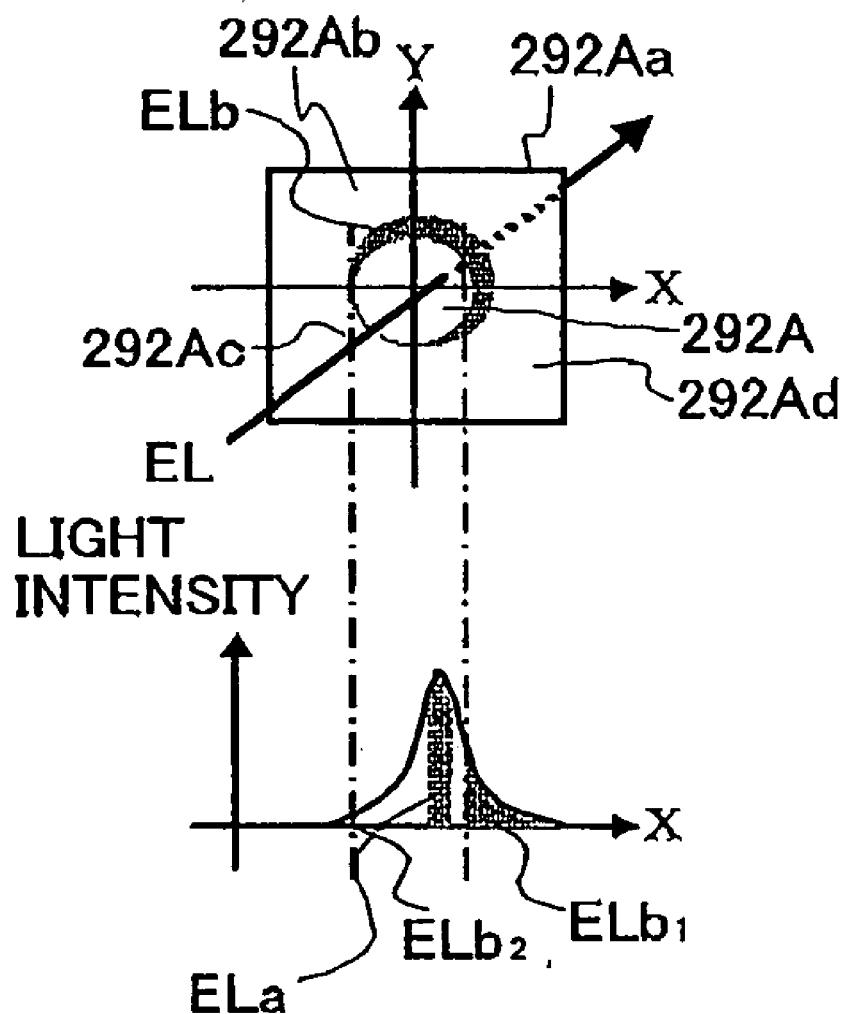
FIG. 20 is a view showing a positional relationship between (a pinhole in) the four-section sensor shown in FIG. 18 and the EUV light, and the light intensity of the EUV light detected by the four-section.

FIGS. 19 and 20 show a positional relationship between (the pinhole 294 of) the four-division sensor 290A and the EUV light EL, and the light intensity of EUV light EL detected at the four-division sensor 70A. In FIGS. 19 and 20, ELa denotes part of the EUV light EL, which is, for example, light used for the exposure. ELb (i.e., $ELb_1$ and $ELb_2$) denotes light that is not used for the exposure, but is irradiated onto the four-division sensor 290A, and used to detect a position of the EUV light EL.

Referring to FIG. 19, the EUV light EL is irradiated onto the center part of the pinhole 294A of the four-division sensor 290A. In this case, the energy is evenly irradiated to the sensor 292Aa to 292Ad of the four-division sensor 290A. However, as shown in FIG. 20, if the EUV light EL is not irradiated to the center part of the pinhole 294A of the four-division sensor 290A, the highest energy is irradiated onto the sensor 292Aa of the four-division sensor 290A. A position (X, Y) of the EUV light EL irradiated onto the four-section sensor 292A is calculated from values of P and Q similar to the four-section sensor 222B, where Ea is the energy irradiated onto the sensor 292Aa, Eb is the energy irradiated onto the sensor 292Ab, Ec is the energy irradiated onto the sensor 292Ac, and Ed is the energy irradiated onto the sensor 292Ad.

Figure 21:
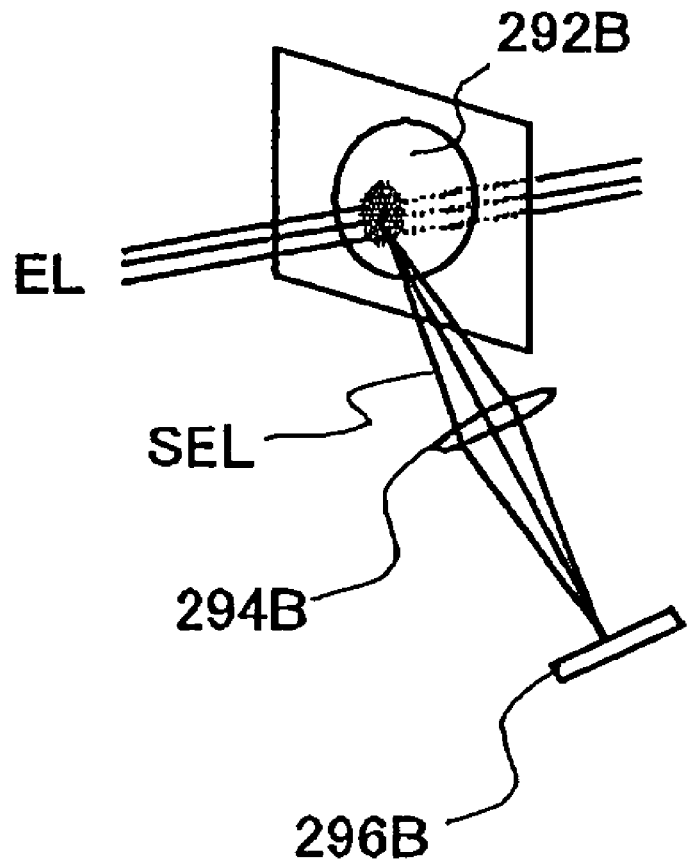
FIG. 21 is a schematic perspective view showing a structure of a detecting mechanism using a filter that serves as one exemplary detecting means shown in FIG. 16.

FIG. 21 is a schematic perspective view of a structure of a detecting mechanism 290B using a filter 292B that serves as one exemplary detecting means 290. Referring to FIG. 21, the detecting mechanism 290B forms an image of scattered light SEL on a lens 294B, which is generated as the EUV light EL is irradiated onto the filter 292B, measures the light through a CCD 296B, and detects a position of the scattered light SEL. The light detected by the CCD 296B may be the infrared light that is generated when the EUV light EL is irradiated onto the filter 292B or the visible light that is generated from the plasma PL together with the EUV light EL. A multilayer coating mirror may be used instead of the lens 294B in an attempt to detect the scattered light SEL of the EUV light EL.

Figure 22:
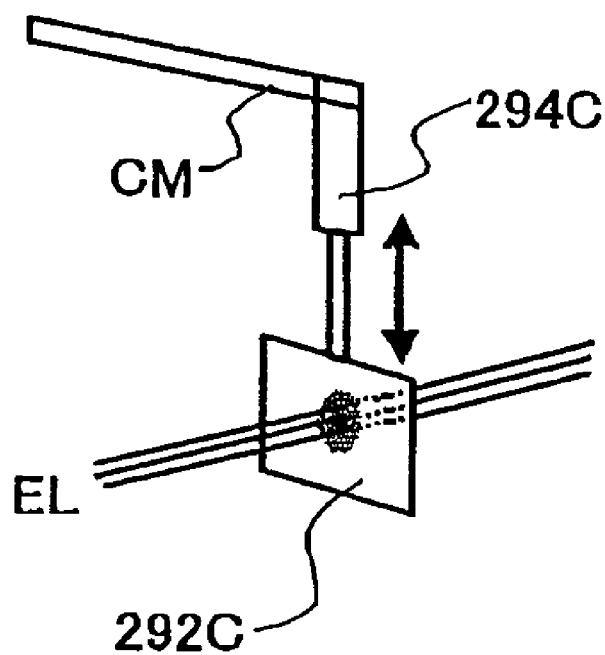
FIG. 22 is a schematic perspective view showing a structure of a detecting mechanism using a two-dimensional CCD that serves as one exemplary detecting means shown in FIG. 16.

FIG. 22 is a schematic perspective view showing a structure of a detecting mechanism 290C using the two-dimensional CCD 292C that serves as one exemplary detecting means 290. Referring to FIG. 22, the detecting mechanism 290C detects a position of the EUV light EL when a moving mechanism 294C removably inserts the two-dimensional CCD 292C into the optical path of the EUV light EL at arbitrary timings. The two-dimensional CCD 292C retreats from the optical path of the EUV light EL, for example, during exposure, and is inserted into the optical path regularly or at proper timings (for example, when the wafer is exchanged) so as to detect a position of the EUV light EL. The moving mechanism 294C is adapted sufficiently rigidly, and the detecting mechanism 290C can precisely detect a positional relationship between the reference point STP and the EUV light EL as in a case where there is no moving mechanism 294C.

Figure 23:
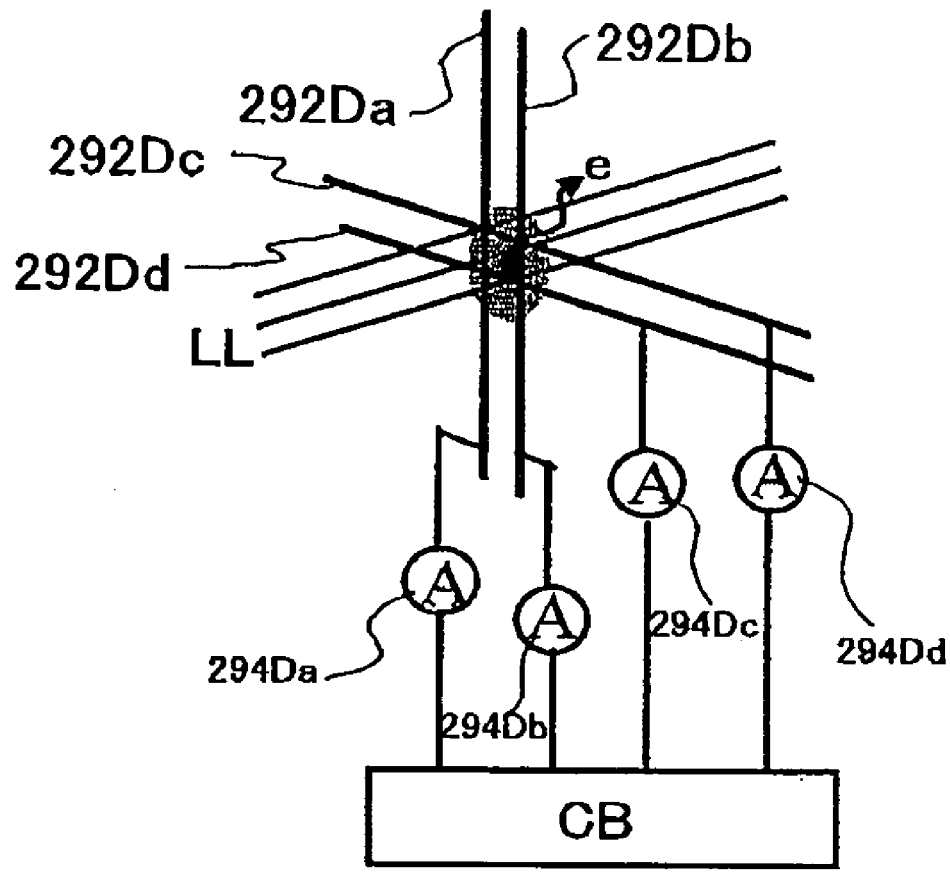
FIG. 23 is a schematic perspective view showing a structure of a detecting mechanism using a wire that serves as one exemplary detecting means shown in FIG. 16.

FIG. 23 is a schematic perspective view of a structure of a detecting mechanism 290D using wires 292Da to 292Dd as one example of the detecting means 290. Referring to FIG. 23, the wires 292Da to 292Dd are connected to the chamber CB via ammeters 294Da to 294Dd. When the EUV light EL is irradiated onto the detecting mechanism 290D, the electrons e are emitted to the wires 292Da to 292Dd. Therefore, the detecting mechanism 290D detects the amplitude of the current (or the electrons e) flowing through the wires 292Da to 292Dd, and detects a position of the EUV light EL. When the wires 292Da to 292Dd are made sufficiently thin, the position of the EUV light EL can be detected without losing the EUV light EL to be supplied to the subsequent optical system.

Figure 33:
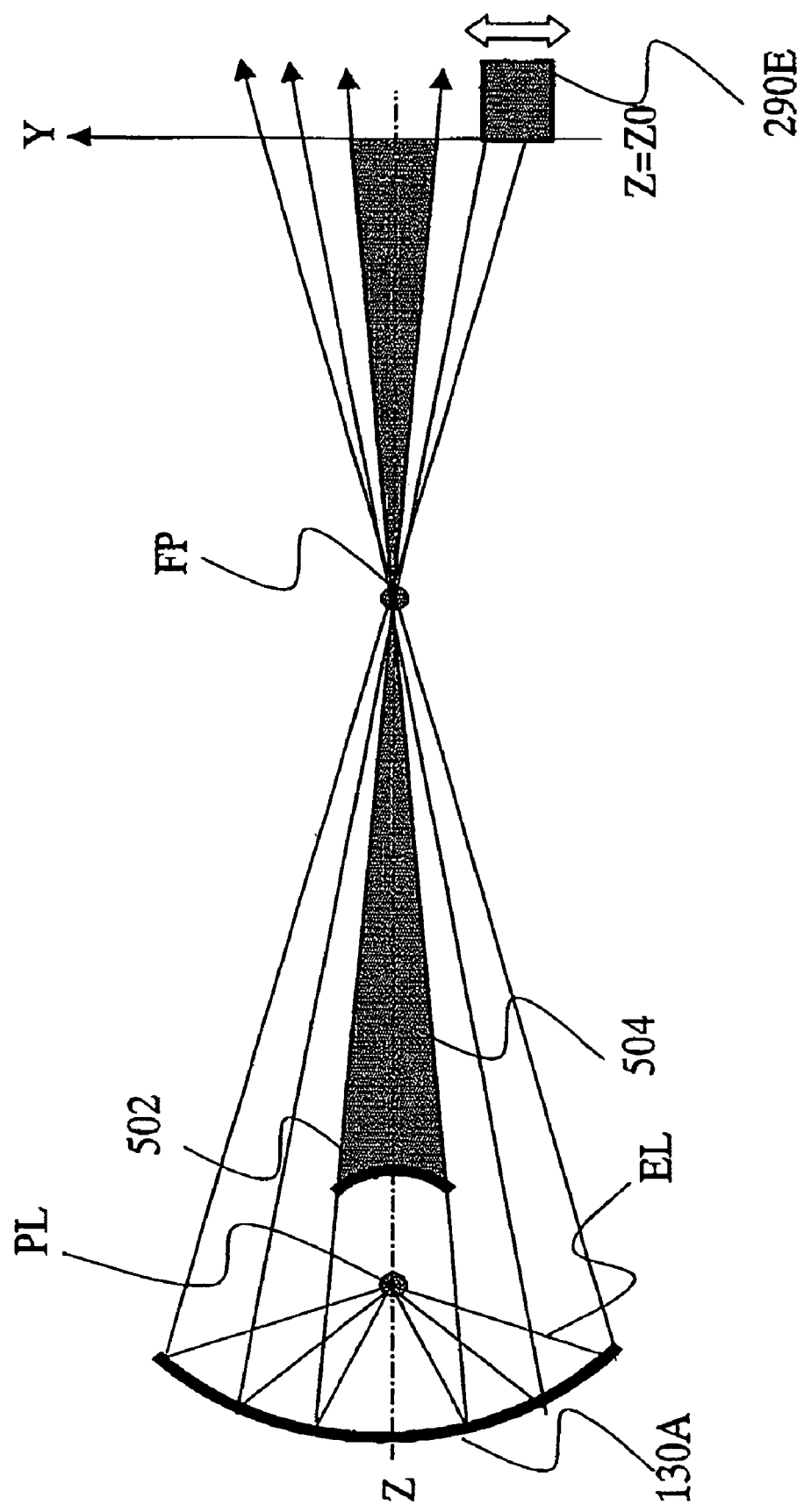
FIG. 33 is a view for explaining the EUV light emitted from the EUV light source shown in FIG. 16.
Figure 34A:
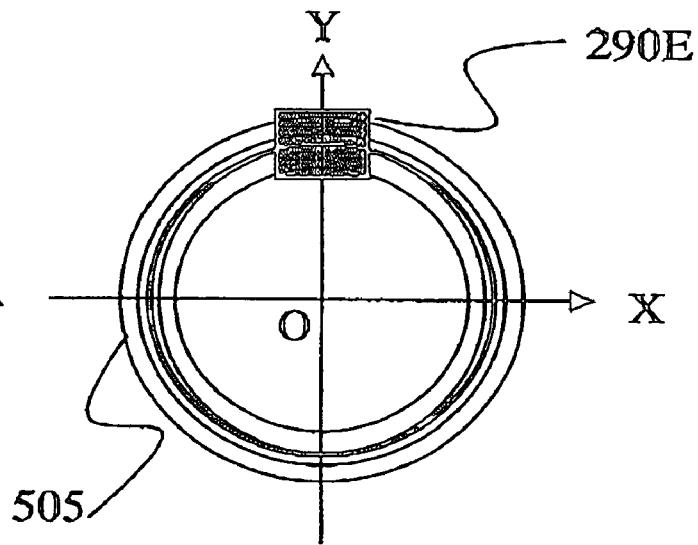
FIGS. 34A and 34B show a light intensity distribution at a position apart from a condensing point of the EUV light emitted from the EUV light source shown in FIG. 16.
Figure 34B:
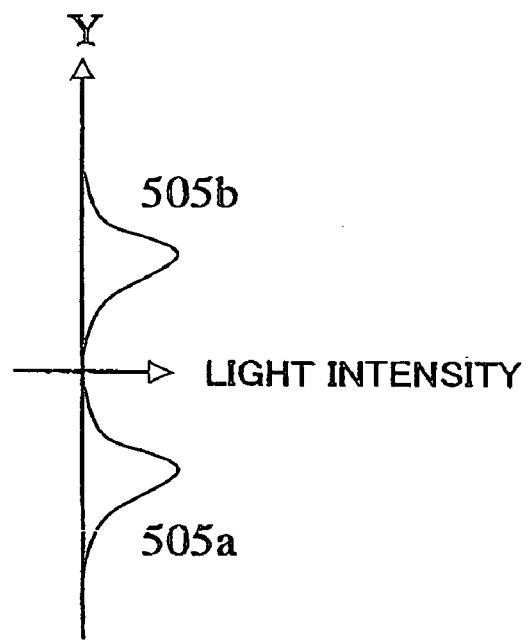

FIG. 33 explains the EUV light emitted from the EUV light source 100E. The EUV light EL emitted from the plasma is reflected by the condenser mirror 130A, and condensed onto the condensing point FP once. Here, the Z-axis coordinate is set to the optical-axis direction. A detecting means 290E that freely moves on a Z=Z0 plane in XY directions simultaneously measures an angle and light intensity of the light that is once condensed at the condensing point FP. A debris remover 502 that removes the debris generated from the plasma PL is placed at the light source unit 100E. Part of the EUV light EL from the plasma PL is missing, and exhibits an annular intensity distribution having no intensity at its center at a position apart from the condensing point FP as shown in FIG. 34A. FIG. 34B is a section that cuts the annular intensity at a position on the X-axis coordinate, and is a graph that plots the light intensity obtained by scanning the detecting means 290E in the Y direction. There are two peaks 505a and 505b corresponding to the annular intensity.

Figure 35:
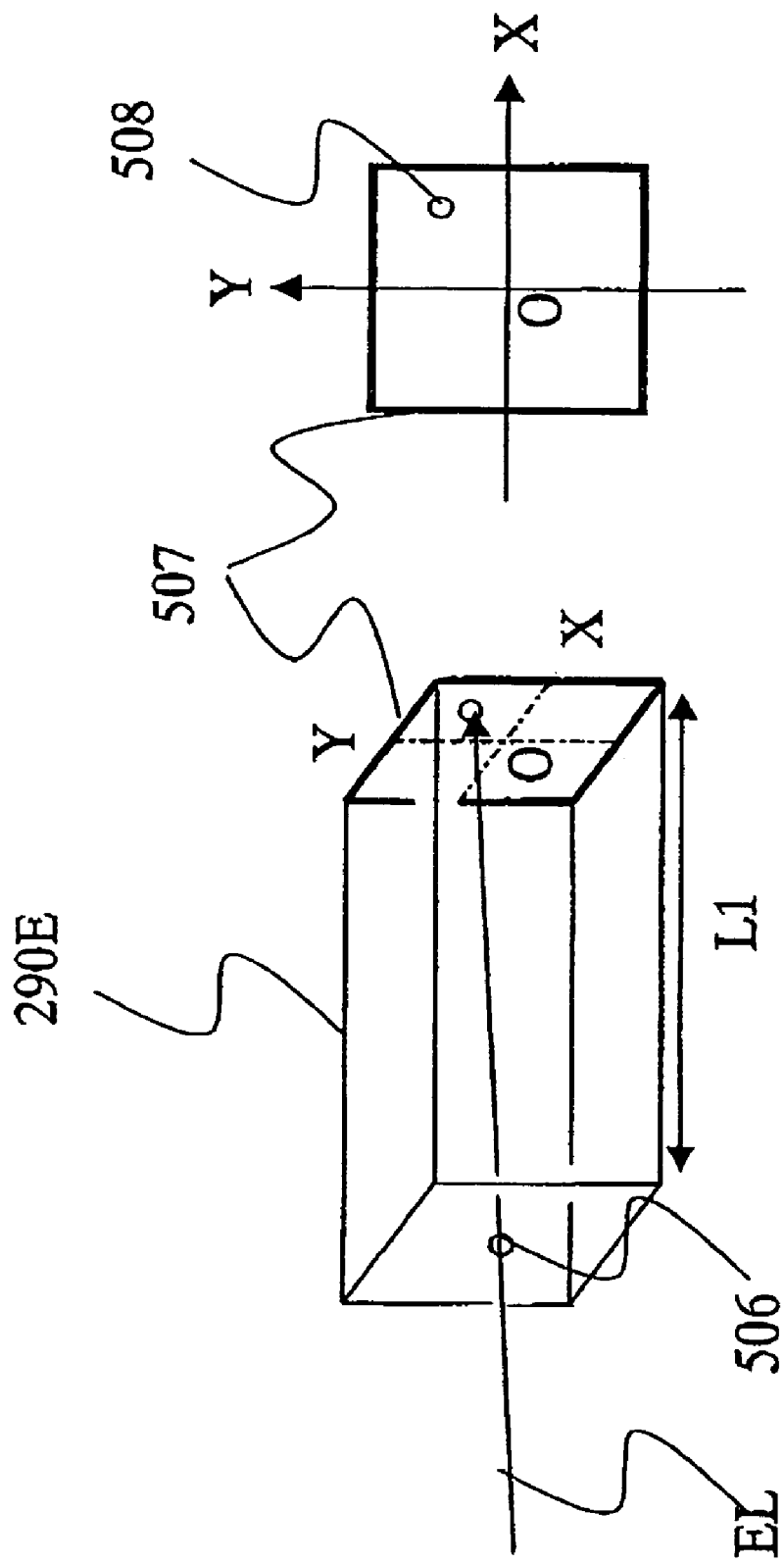
FIG. 35 is a view for explaining the detecting means shown in FIG. 33.
Figure 36:
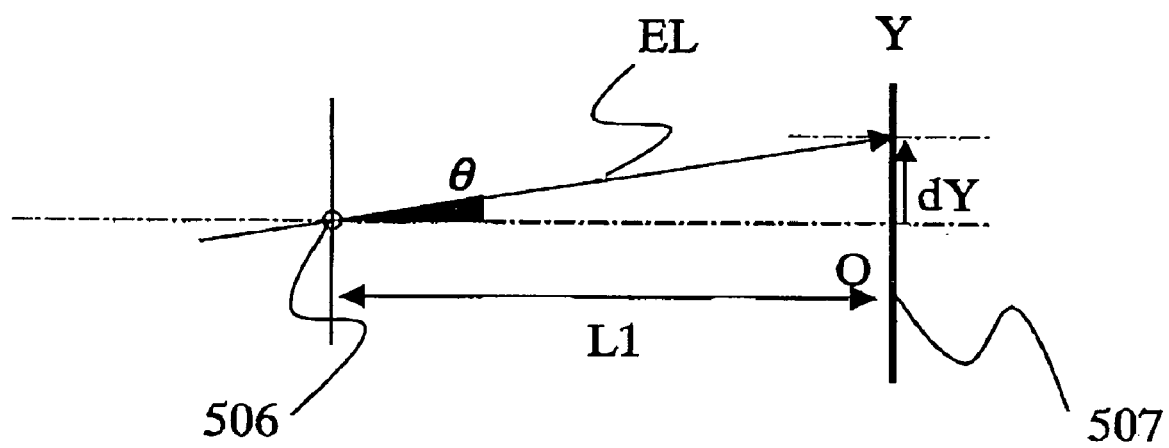
FIG. 36 is a view for explaining an angle calculating method.

Referring now to FIG. 35, a description will be given of the detecting means 290E. The EUV light EL is irradiated from a pinhole 506 in the detecting means 290E onto a position 508 on a two-dimensional sensor 507 behind the pinhole. This configuration provides a detection of an angle of the incident light. The two-dimensional sensor may use, for example, a two-dimensional CCD or a two-dimensional PSD. FIG. 36 shows an angular calculation method. If the EUV light EL passes through the pinhole 506 and is irradiated onto a position that changes by dY on the two-dimensional sensor 507, an angle of EL can be calculated by $\tan \theta = dY/L1$.

Figure 37:
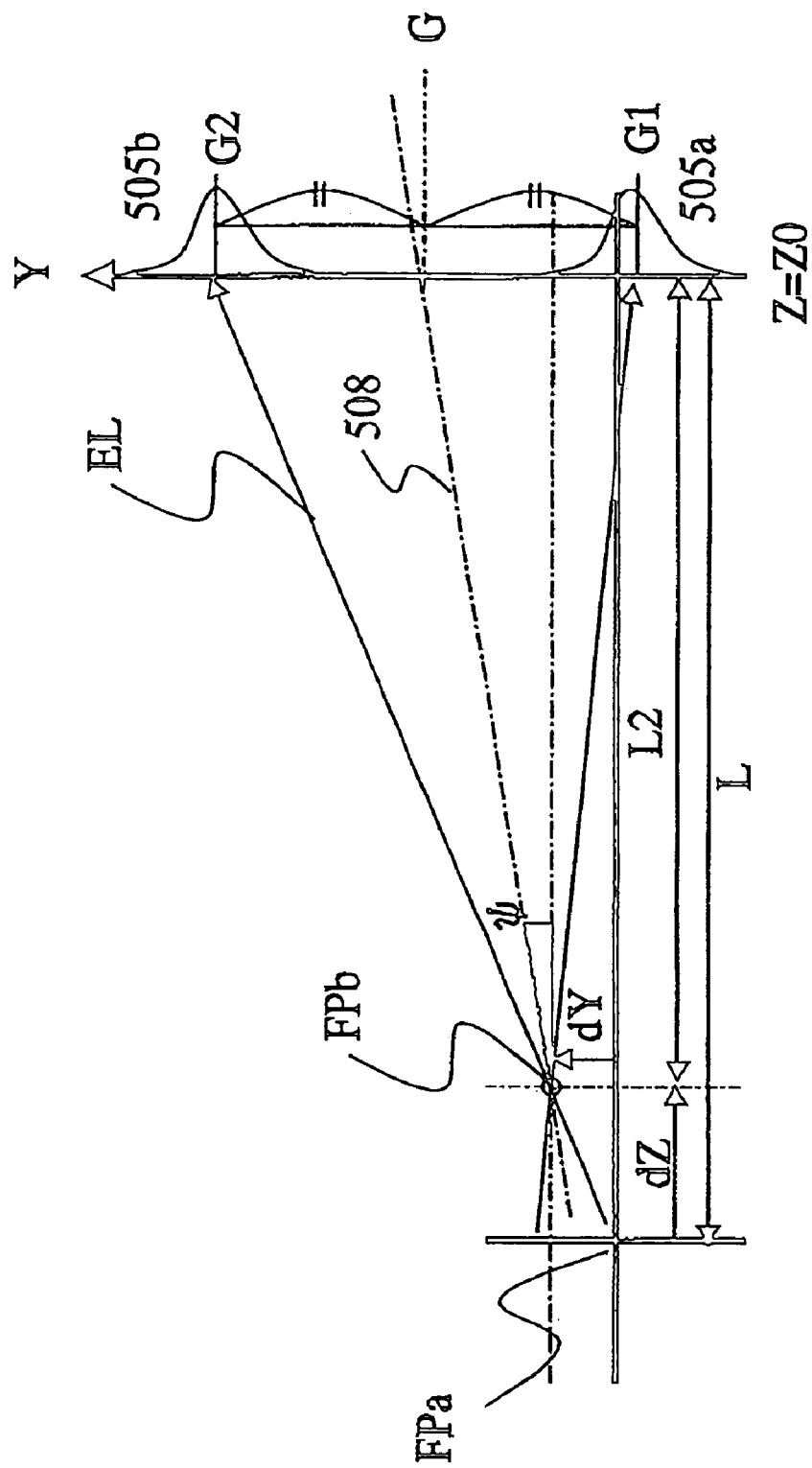
FIG. 37 is a view for explaining an angle calculating method.
Figure 38:
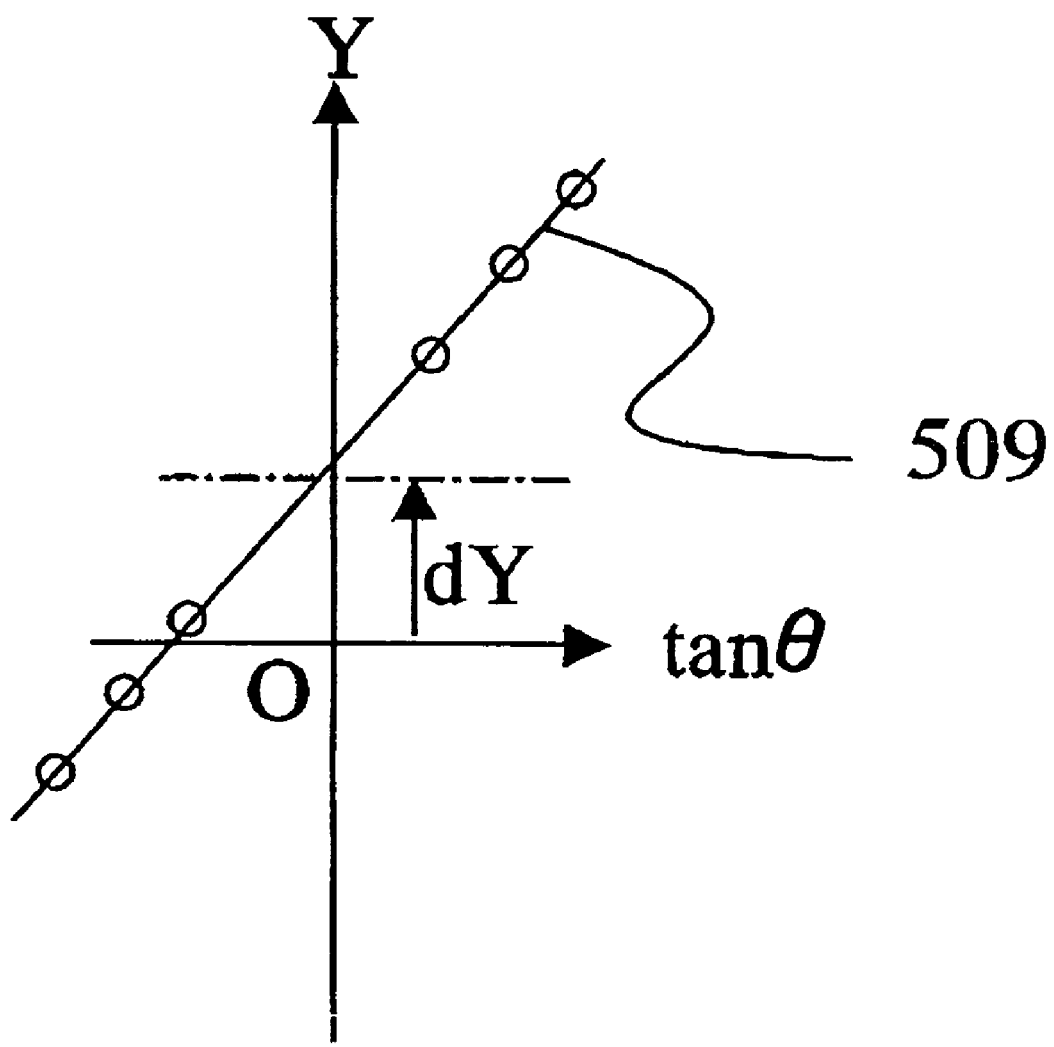
FIG. 38 is a view for explaining an angle calculating method.

FIG. 37 is a view for explaining a concrete method of calculating an angle of the optical axis of the EUV light source 100E by using the detecting means 290E described with reference to FIGS. 33 to 36. Suppose that a position of the condensing point FP shifts from FPa by dZ in the Z direction and dY in in the Y direction FIG. 37. Similar to FIG. 33, the Z=Z0 plane is scanned and the light intensity and incident angle are measured on each position. Suppose that the result of measuring the incident angle is, for example, as shown in FIG. 40. In FIG. 38, an angle of the incident light is 0 at Y=dY, and $\tan \theta$ relating to the incident angle $\theta$ at the measuring position Y is plotted like a line 509 having a gradient "a." On the other hand, where L2 is a distance from the condensing point FPb that has moved once to the Z=Z0 plane, the angle of the incident light is expressed by $\tan \theta = Y/L2$. Therefore, $Y/\tan \theta = L2$ is established, and this givens a gradient of the line 509. From this scheme, fluctuations of the condensing point FP in Z and Y directions can be calculated. Although this embodiment discusses the fluctuations of the condensing point FP only in Z and Y directions, the fluctuation in the X direction can be measured in the same way as the calculation method in the Y direction.

Suppose that when the light intensity distribution obtained by scanning the detecting means 290E is shown in FIG. 37, the center of gravity of 505a is G1 and the center of gravity of 505b is G2. Where G is a midpoint between G1 and G2, it is understood that the optical axis 508 passes the point G and an angle $\phi$ of the optical axis is given by $\tan \phi = (G-dY)/L2$. While this embodiment discusses only the rotational amount $\phi$ around the X-axis, the rotational amount around the Y-axis can be measured similarly.

Thus, this configuration can measure a positional fluctuation of the central condensing point of the EUV light source having a condensing point and an angular fluctuation of the optical axis.

Figure 26:
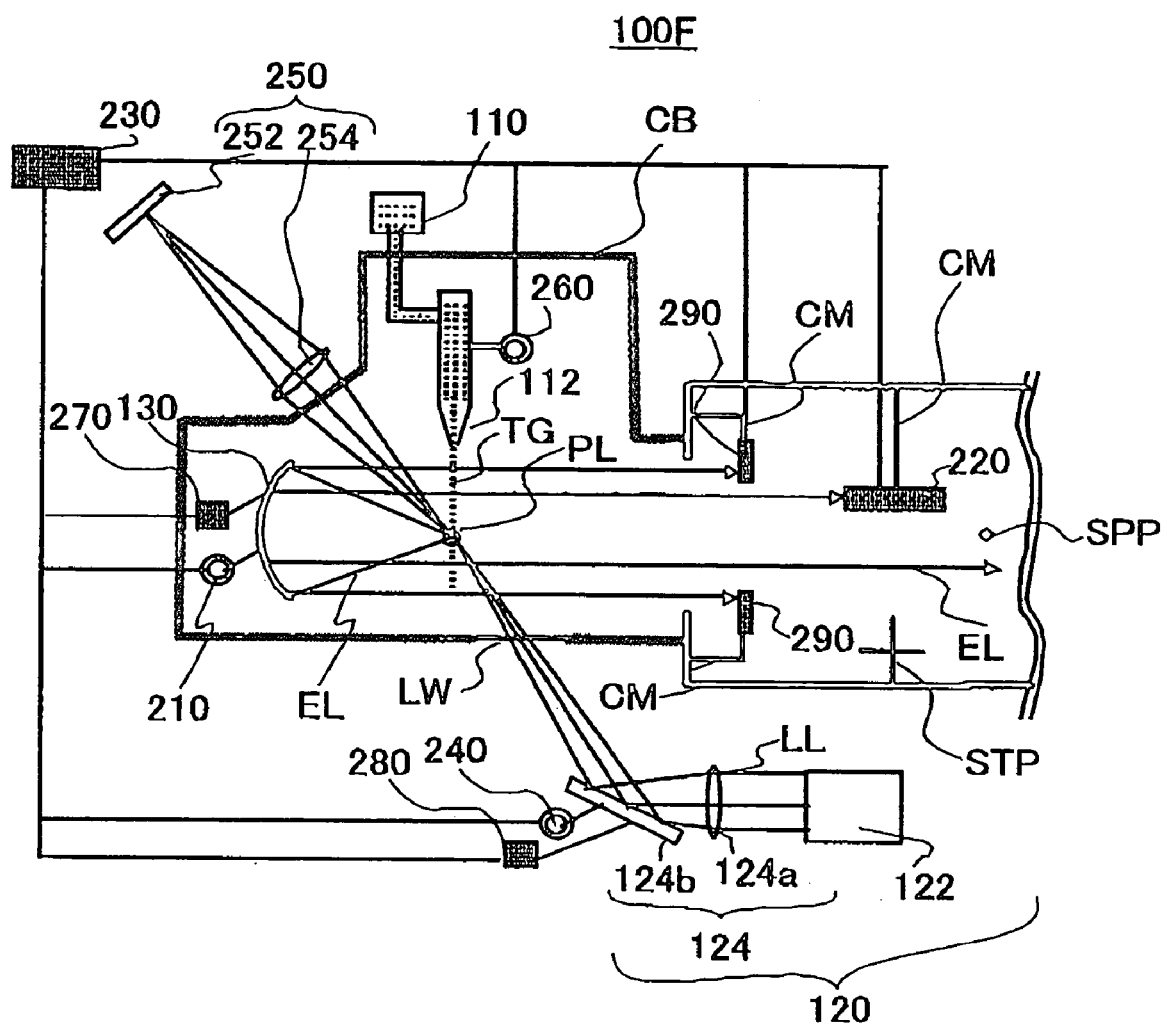
FIG. 26 is a schematic sectional view showing a structure of a modification of the light source unit shown in FIG. 1.
Figure 27:
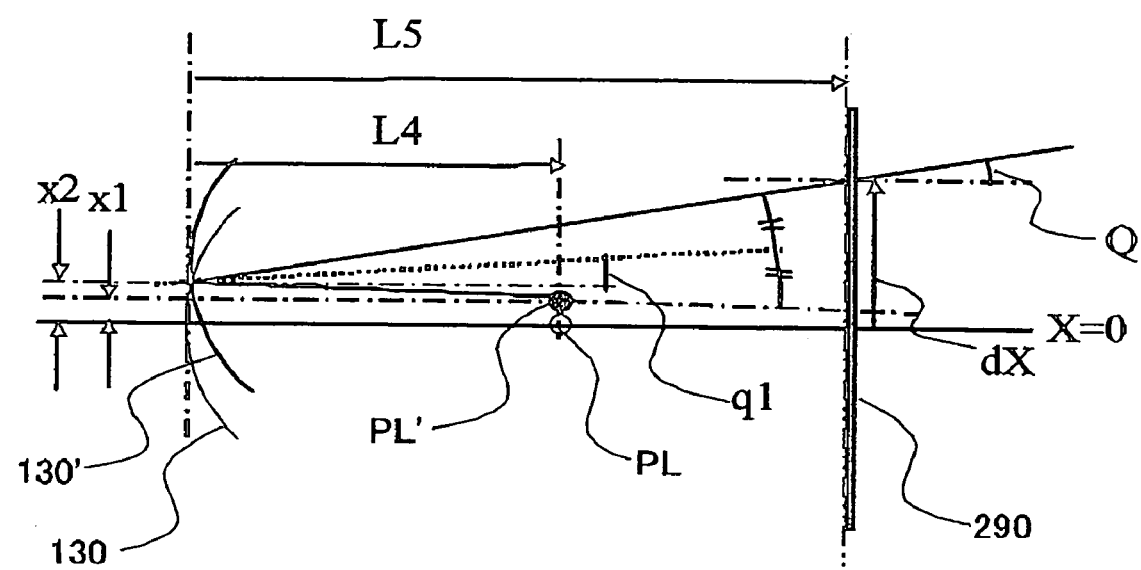
FIG. 27 is a schematic sectional view showing principal part of the light source unit shown in FIG. 26.

Referring now to FIGS. 26 and 27, a description will be given of a light source unit 100F as a variation of the light source unit 100. FIG. 26 is a schematic sectional view of the structure of the light source unit 100F. The light source unit 100F includes all of the above measuring means 200 to 200E, and maintains the position and/or angle of the EUV light EL in place (or at the supply point SPP) relative to the reference point STP.

FIG. 27 is a schematic sectional view showing principal part of the light source unit 100F shown in FIG. 26. FIG. 27 shows the light source unit 10F only around the Y-axis for simple description. L4 denotes a distance from the generating point of the EUV light (or the position of the plasma PL) to the optical element 130. L5 is a distance from the detecting means 290 to the optical element 130.

Referring to FIG. 27, when a position of the plasma PL moves to a position of the plasma PL', a position of the optical element 130 moves to a position of the optical element 130', and an angle moves by q1, the EUV light EL turns to the EUV light EL' at the position of the detecting means 290. A position of the optical axis fluctuates as expressed by Equation 9 below. An angle of the optical axis fluctuates as expressed by Equation 10 below:

$$dX = L5 \times (2 \times q1 + (x2-x1)/L4) + x2 \quad \text{[EQUATION 9]}$$

$$Q = 2 \times q1 + (x2-x1)/L4 \quad \text{[EQUATION 10]}$$

Using this, the light source unit 100F maintains the position and angle of the EUV light EL at the supply point SPP.

Figure 28:
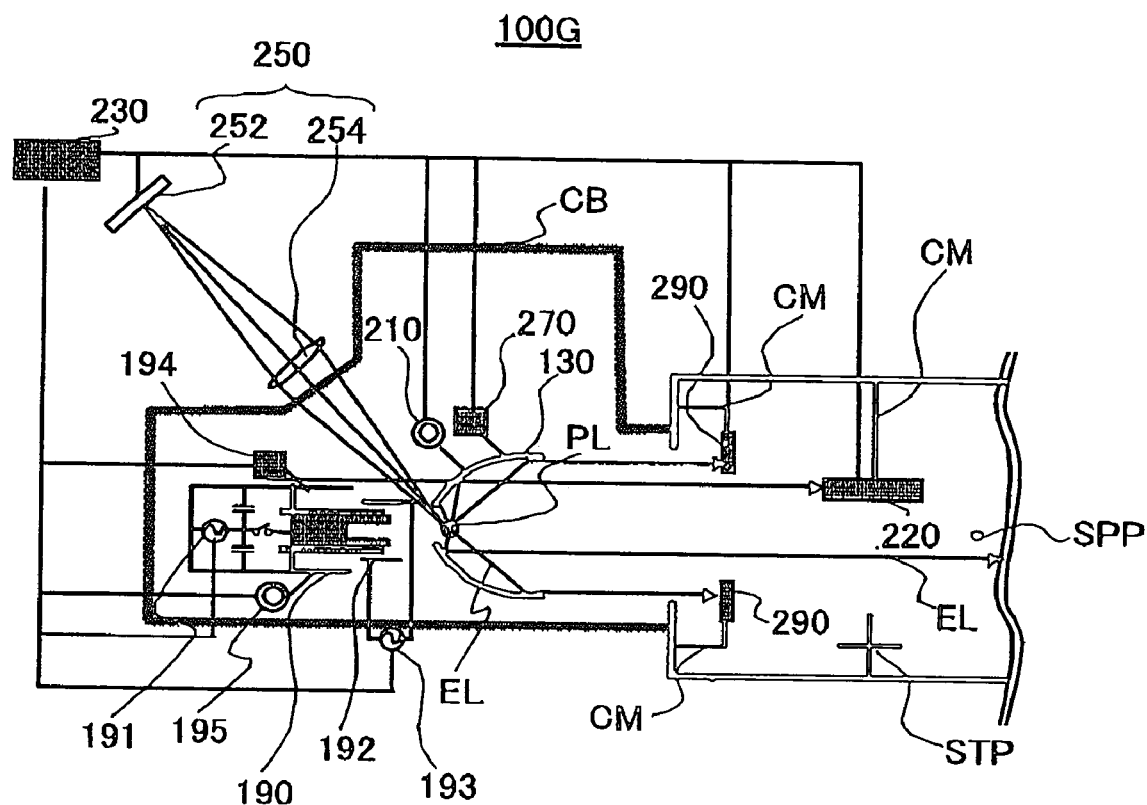
FIG. 28 is a schematic sectional view showing a structure of a light source unit according to one aspect of the present invention.

The stabilizing means is not limited to a laser plasma type light source unit but is applicable to a discharge type light source unit 100G, as shown in FIG. 28. FIG. 28 is a schematic sectional view showing a structure of the light source unit 100G according to one aspect of the present invention. In comparison with the laser plasma type light source unit, the discharge type light source unit needs no target supply unit or laser unit but other than that, it is structurally similar to the laser plasma type light source unit.

In FIG. 28, 190 denotes a discharge type plasma light source. 191 denotes a field application unit for applying the electric field. 193 is a field application unit that applies a proper voltage to an electrode 192. In addition, the stabilizing means in the light source unit 100G includes a detecting means 194 for detecting a position and/or angle of the plasma light source, and an adjusting means 195 for adjusting the position and/or angle of the plasma light source.

In the light source unit 100G, the EUV light EL generated from the plasma PL is condensed by the optical element 130, and introduced into the subsequent optical system. A detecting means 250 is provided to detect the generating position of the EUV light EL (or the plasma PL).

In FIG. 28, data regarding how the plasma PL changes as the field application unit 193 changes the electric field is previously obtained. In supplying the EUV light EL, the field application unit 193 applies the electric field according to the positional changes of the plasma PL detected by the detecting means 270. As a result, the EUV light can be supplied to the supply point SPP. In other words, a positional relationship between the optical axis of the supplied EUV light EL and the reference point SPP can be maintained.

The electric field may be applied solely by the field application unit 191 in the plasma generator 190 or by a combination the field application unit 191 with the additional field application unit 193.

It is possible to detect a position and angle of the optical axis of the EUV light EL by using the detecting means 220, 290 and 194 etc., and maintain the position and angle of the optical axis of the EUV light EL relative to the reference point STP by using the appropriate adjusting means 270 and 195 and field application units 191 and 193.

For example, the light source unit 100G may detect an angle of the EUV light EL by using the detecting means 220 and drive the optical element 130, detect a position of the plasma PL by using the detecting means 250 and drive the optical element 130, or detect a position and angle of the optical axis of the EUV light EL by using the detecting means 220 and 290 and maintain the position and angle of the optical axis of the EUV light EL relative to the reference point STP by using the appropriate adjusting means 270 and 195 and field application units 191 and 193.

As discussed above, the light source units 100 to 100G can detect fluctuations of a generating position of the EUV light caused by various factors, and maintain the supplied EUV light in place relative to the reference point through the appropriate adjusting means. Therefore, the light source unites 100 to 10G can stably supply the EUV light to the exposure apparatus, etc.

Figure 29:
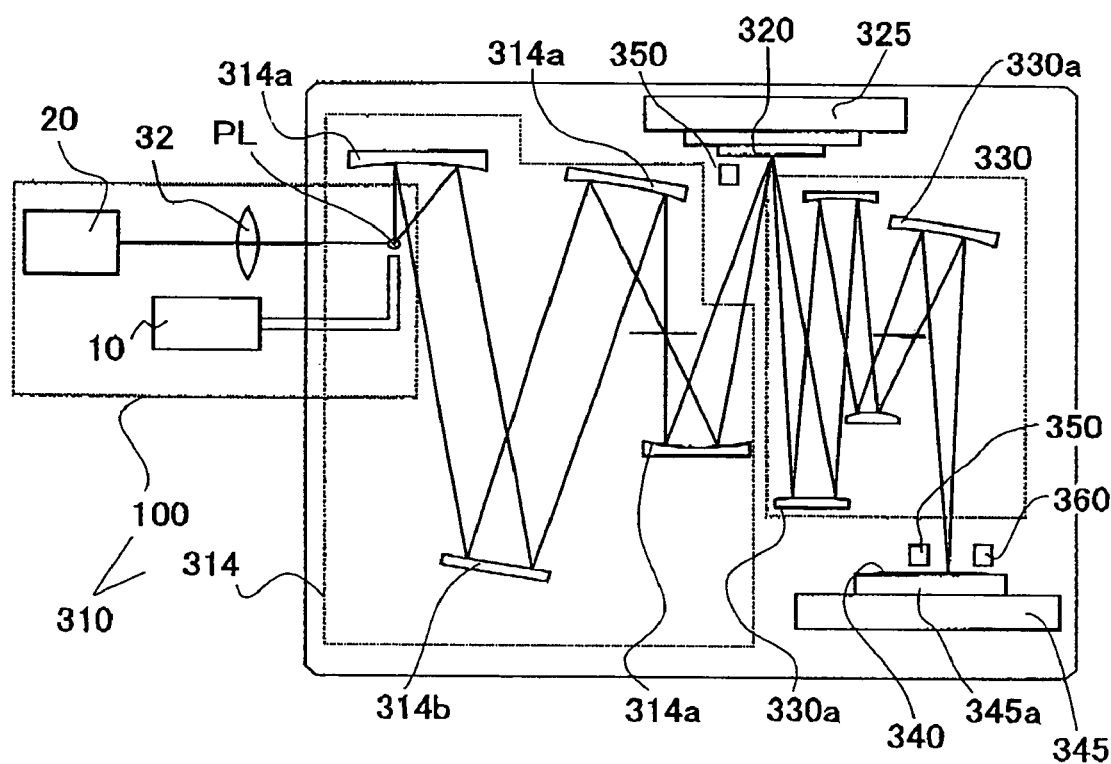
FIG. 29 is a schematic block diagram of a structure of an exposure apparatus according to one aspect of the present invention.

Referring to FIG. 29, a description will be given of an exemplary exposure apparatus 300 that applies the inventive light source unit 100. Here, FIG. 29 is a schematic block diagram of the exposure apparatus 300 according to one aspect of t he present invention.

The inventive exposure apparatus 300 uses the EUV light (with a wavelength of, e.g., 13.4 nm) as illumination light for exposure, and exposes onto an object 340 a circuit pattern of a mask 320, for example, in a step-and-scan manner. Of course, the present invention is applicable to a step-and-repeat exposure apparatus ("stepper"). This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat" manner is another mode of exposure method that moves a wafer stepwise to an exposure area for the next shot every shot of cell projection onto the wafer.

Referring to FIG. 29, the exposure apparatus 300 includes an illumination apparatus 310, a reticle stage 325 mounted with the mask 320, a projection optical system 330, a wafer stage 345 mounted with the object 340, an alignment detecting mechanism 350, and a focus position detecting mechanism 360.

The illumination apparatus 310 illuminates the mask 320 using the EUV light that has a wavelength of, for example, 13.4 nm and an arc shape corresponding to an arc-shaped field of the projection optical system 330, and includes the light source unit 100 and an illumination optical system 314.

The light source unit 100 may apply any of the above structures, and a detailed description thereof will be omitted.

The illumination optical system 314 includes a condenser mirror 314a and an optical integrator 314b. The condenser mirror 314a serves to collect EUV light that is irradiated approximately isotropically from the laser plasma, and the optical integrator 314b uniformly illuminates the mask 320 with a predetermined aperture.

The mask 320 is a reflection mask, and has a circuit pattern (or image) to be transferred. The mask 320 is supported and driven by the reticle stage 325. The diffracted light emitted from the mask 320 is projected onto the object 340 after reflected by the projection optical system 330. The mask 320 and the object 340 are arranged optically conjugate with each other. Since the exposure apparatus 300 is a scanner, the mask 320 and object 340 are scanned to transfer a reduced size of a pattern of the mask 320 onto the object 340.

The reticle stage 325 supports the mask 320 and is connected to a moving mechanism (not shown). The reticle stage 325 may use any structure known in the art. The moving mechanism (not shown) may includes a linear motor etc., and drives the reticle stage 325 at least in a direction X and moves the mask 320. The exposure apparatus 300 synchronously scans the mask 320 and the object 340.

The projection optical system 330 uses plural multilayer coating mirrors 330a to project a reduce size of a pattern of the mask 320 onto the object 340. The number of mirrors 330a is about four to six. For wide exposure area with the small number of mirrors, the mask 320 and object 340 are simultaneously scanned to transfer a wide area that is an arc-shape area or ring field apart from the optical axis by a predetermined distance. The projection optical system 330 has a NA of about 0.2 to 0.3.

The instant embodiment uses a wafer as the object 340 to be exposed, but it may include a spherical semiconductor and liquid crystal plate and a wide range of other objects to be exposed. Photoresist is applied onto the object 340.

The object 340 to be exposed is held by the wafer stage 345 by a wafer chuck 345a. The wafer stage 345 moves the object 340, for example, using a linear motor in XYZ directions. The mask 320 and the object 340 are synchronously scanned. The positions of the reticle stage 325 and wafer stage 345 are monitored, for example, by a laser interferometer, and driven at a constant speed ratio.

The alignment detecting mechanism 350 measures a positional relationship between the position of the mask 320 and the optical axis of the projection optical system 330, and a positional relationship between the position of the object 340 and the optical axis of the projection optical system 330, and sets positions and angles of the reticle stage 325 and the wafer stage 345 so that a projected image of the mask 320 may accord with the object 340.

The focus position detecting mechanism 360 measures a focus position on the object 340 surface, and controls over a position and angle of the wafer stage 345 always maintains the object 340 surface at an imaging position of the projection optical system 330 during exposure.

In exposure, the EUV light emitted from the illumination apparatus 310 illuminates the mask 320, and images a pattern of the mask 320 onto the object 340 surface. The instant embodiment uses an arc or ring shaped image plane, scans the mask 320 and object 340 at a speed ratio corresponding to a reduction rate to expose the entire surface of the mask 320. The light source unit 100 in the illumination apparatus 310 in the exposure apparatus 300 maintains a position of the supplied EUV light in place. Therefore, the exposure apparatus 300 achieves an excellent exposure performance, and provides devices (such as semiconductor devices, LCD devices, image-pickup devices (e.g., CCDs), and thin film magnetic heads) with a high throughput and good economical efficiency.

Figure 30:
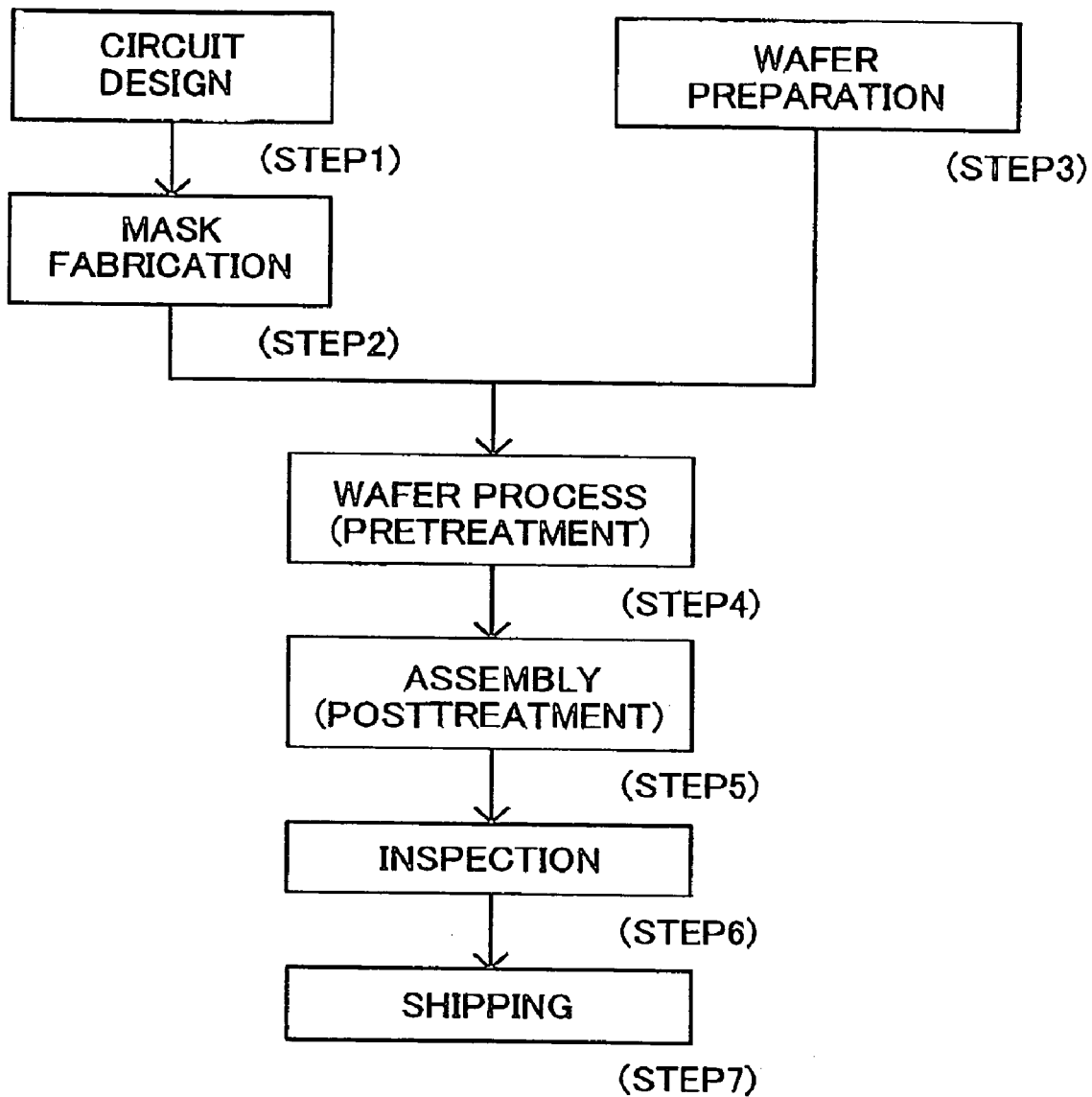
FIG. 30 is a flowchart for explaining a method for fabricating devices (semiconductor chips such as ICs, LSIs, and the like, LCDs, CCDs, etc.).
Figure 31:
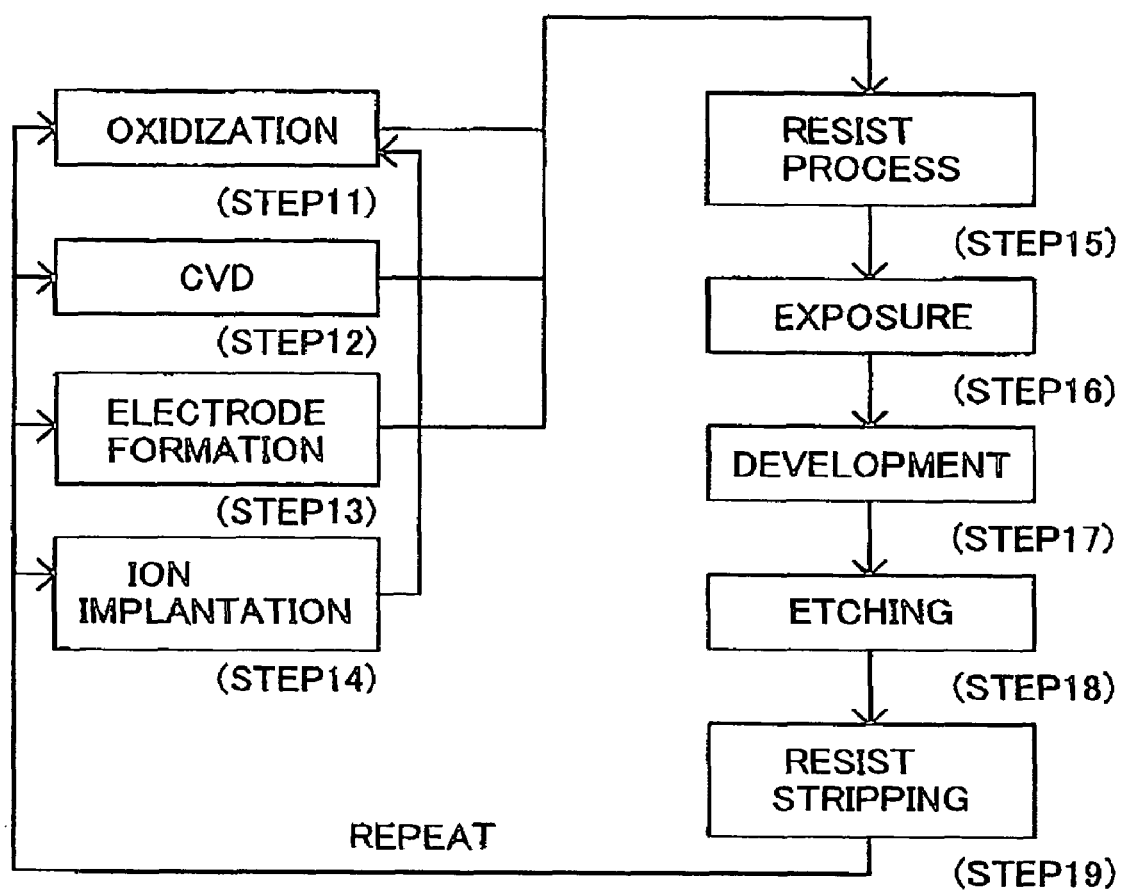
FIG. 31 is a detailed flowchart for Step 4 of wafer process shown in FIG. 30.

Referring now to FIGS. 30 and 31, a description will be given of an embodiment of a device fabrication method using the above mentioned exposure apparatus 1. FIG. 10 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 300, and resultant devices constitute one aspect of the present invention.

Figure 32:
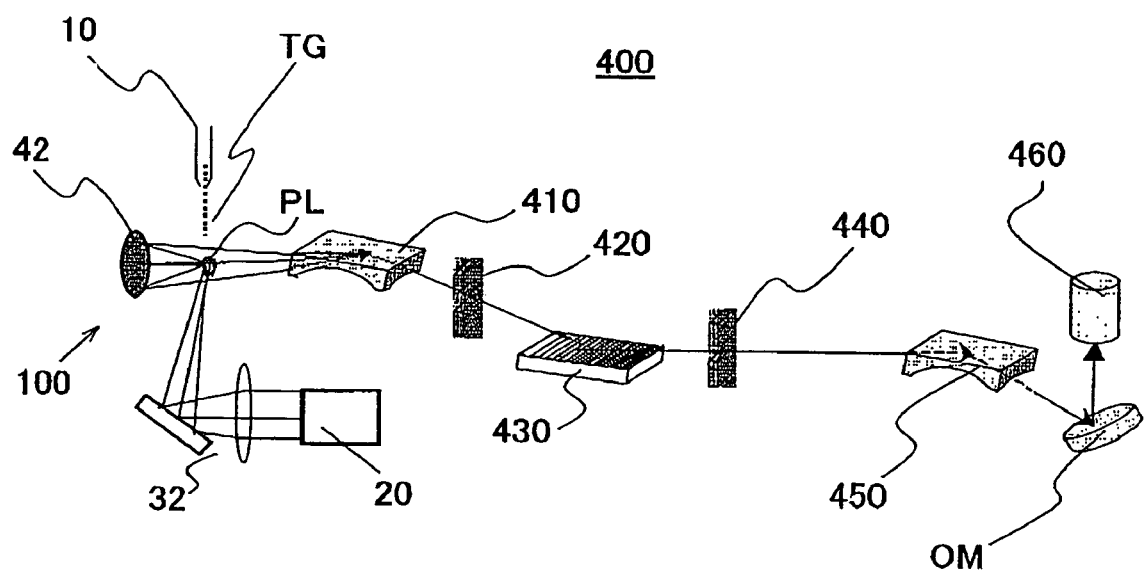
FIG. 32 is a schematic perspective view of a structure of a measuring apparatus according to one aspect of the present invention.

Moreover, the light source unit 100 can be applied also to the measuring apparatus 400 that measures a reflectivity of an object to be measured OM as shown in FIG. 32. FIG. 32 is a schematic perspective view of the measuring apparatus 400 according to one aspect of the present invention. The measuring apparatus 400 includes a front mirror 410, a slit 420, a diffraction grating 430, a slit 440, a rear mirror 450, and a detector 460.

Referring to FIG. 32, the measuring apparatus 400 condenses and reflects the laser light LL generated at the laser light source part 20 by the laser optical system 32, and generates the EUV light EL by irradiating it to the target TG supplied from the target supply apparatus 10. The EUV light EL is condensed by the condenser mirror 42, passes through the front mirror 410 and slit 420, is dispersed by the diffraction grating 430, is selected only the desired wavelength by the slit 440, reflects by the rear mirror 450, is irradiated to the object to be measured OM, and detects the size of the reflection light from the object to be measured OM by the detector 460. The measuring apparatus 400 can measure reflectivity in high accuracy by using the light source unit 100.

Thus, the above embodiments can provide a light source unit that maintains the supplied light at a predetermined position with respect to a reference position, and an exposure apparatus having the light source unit and realizes superior exposure performance.

Furthermore, the present invention is not limited to these preferred embodiments and various variations and modifications may be made without departing from the scope of the present invention.

This application claims a foreign priority benefit based on Japanese Patent Applications No. 2004-207856, filed on Jul. 14, 2004, which is hereby incorporated by reference herein in its entirety as if fully set forth herein.

What is claimed is:

1. A light source unit for supplying light radiated from plasma, said light source unit comprising:
    a stabilizer for reducing a fluctuation of a position of the light radiated from the plasma;
    a target supply unit for supplying a target;
    a laser unit for generating the plasma, the laser unit including a laser generator for emitting a laser beam and a condenser for condensing the laser beam; and
    and optical element for condensing the light emitted from the plasma, wherein said stabilizer includes:
        at least one of a first detector for detecting a position of the light, a second detector for detecting a position of the plasma, a third detector for detecting a position and/or an angle of said optical element, and a fourth detector for detecting a position and/or angle of the condenser;
        at least one of a first adjuster for adjusting a position and/or angle of said optical element, a second adjuster for adjusting a position and/or angle of the condenser, and a third adjuster for adjusting a position and/or angle of said target supply unit; and
        a controller for controlling at least one of the first to third adjusters so as to maintain a position of the light in place based on a detection result by at least one of the first to fourth detectors.

2. An exposure apparatus for exposing a pattern of a mask onto an object, said exposure apparatus comprising:
    a light source unit according to claim 1;
    an illumination optical system for illuminating the reticle using light supplied from said light source unit; and
    a projection optical system for projecting the pattern of the reticle onto the object.

3. A device manufacturing method comprising the steps of:
    exposing an object using an exposure apparatus; and
    developing the object that has been exposed,
    wherein said exposure apparatus includes:
        a light source unit according to claim 1;
        an illumination optical system for illuminating the reticle using light supplied from said light source unit; and
        a projection optical system for projecting the pattern of the reticle onto the object.

4. A measuring apparatus for measuring reflectance of an object, said measuring apparatus comprising:
    a light source unit according to claim 1;
    an irradiating unit for irradiating light supplied from said light source unit upon the object; and
    a detector for detecting the light reflected from the object.

5. A light source unit for supplying light radiated from plasma, said light source unit comprising:
    a stabilizer for reducing a fluctuation of a position of the light radiated from the plasma;
    a gas supply unit for supplying working gas;
    a voltage feeder including an electrode for applying a voltage to the working gas, said voltage feeder generating the plasma; and
    an optical element for condensing the light emitted from the plasma;
    wherein said stabilizer includes:
        at least one of a first detector for detecting a position of the light, a second detector for detecting a position of the plasma, a third detector for detecting a position and/or angle of said optical element, and a fourth detector for detecting a position and/or angle of the electrode;
        at least one of a first adjuster for adjusting a position and/or angle of said optical element, and a second adjuster for adjusting a position and/or angle of the electrode; and
        a controller for controlling at least one of the first and second adjusters so as to maintain a position of the light in place based on a detection result by at least one of the first and second detectors.

* * * * *